United States Patent [19]
Ide

[11] Patent Number: 5,952,884
[45] Date of Patent: Sep. 14, 1999

[54] CURRENT MIRROR CIRCUIT AND SEMICONDUCTOR INTEGRATED CIRCUIT HAVING THE CURRENT MIRROR CIRCUIT

[75] Inventor: Satoshi Ide, Kawasaki, Japan

[73] Assignee: Fujitsu Limited, Kanagawa, Japan

[21] Appl. No.: 09/109,290

[22] Filed: Jun. 30, 1998

[30] Foreign Application Priority Data

Feb. 18, 1998 [JP] Japan .................................. 10-036118

[51] Int. Cl.⁶ ...................................................... H03F 3/04
[52] U.S. Cl. ............................................ 330/288; 323/315
[58] Field of Search ................................... 330/288, 257; 323/315, 316

[56] References Cited

U.S. PATENT DOCUMENTS

| | | | |
|---|---|---|---|
| 4,284,959 | 8/1981 | Heagerty et al. | 330/253 |
| 4,477,782 | 10/1984 | Swanson . | |
| 5,444,363 | 8/1995 | Cabler | 323/315 |
| 5,568,082 | 10/1996 | Hedberg | 327/437 |
| 5,835,994 | 11/1998 | Adams | 323/315 |
| 5,892,402 | 4/1999 | Tsubaki et al. | 332/288 |

FOREIGN PATENT DOCUMENTS

| | | |
|---|---|---|
| 2124609 | 5/1990 | Japan . |
| 4064989 | 2/1992 | Japan . |
| 6104762 | 4/1994 | Japan . |
| 1026996 | 2/1996 | Japan . |
| 9148853 | 6/1997 | Japan . |

*Primary Examiner*—Robert Pascal
*Assistant Examiner*—Henry Choe
*Attorney, Agent, or Firm*—Helfgott & Karas, P.C.

[57] ABSTRACT

A current mirror circuit has a reference current source for supplying a reference current, and a plurality of field effect transistors including an input circuit connected to the reference current source and supplied with the reference current and at least an output circuit connected to the input circuit in a current mirror fashion. The input circuit has first and second input transistors connected in series with each other. The gates of the first and second input transistors are connected both to the drain of the second input transistor. The drain of the second input transistor is connected to the reference current source. The output circuit has first and second output transistors connected in series with each other. The source of the first output transistor is connected to the source of the first input transistor. The gates of the first and second output transistors are connected to the gates of the first and second input transistors, respectively. Further, an output current is produced from the drain of the second output transistor. The second input transistor is operated with a voltage not higher than the threshold voltage of the first input transistor. As a result, the output impedance can be increased even with a low source voltage, and the mirror ratio can be set with a high accuracy.

74 Claims, 14 Drawing Sheets

CURRENT MIRROR CIRCUIT AND SEMICONDUCTOR INTEGRATED CIRCUIT HAVING THE CURRENT MIRROR CIRCUIT

BACKGROUND OF THE INVENTION

1. Field of the Invention

The present invention relates to a current mirror circuit and a semiconductor integrated circuit having the current mirror circuit, and more particularly, to a current mirror circuit using a FET (field effect transistor) capable of being driven at a low voltage.

2. Description of the Related Art

Conventionally, a current mirror circuit has been widely used for various circuits and is required to be capable of setting a mirror ratio with high accuracy. A circuit on which the current mirror circuit is mounted, on the other hand, tends to require a low driving voltage, and therefore a current mirror drivable with a low voltage is required.

A conventional current mirror circuit comprises, for example, a reference current source for supplying a reference current, an input circuit and an output circuit. For example, the input circuit includes a n-channel MOS transistor (nMOS transistor), and the output circuit includes a nMOS transistor. These transistors of the input circuit and output circuit constitute a current mirror fashion (current mirror circuit).

The transistor of the output circuit is saturated when the voltage applied to an output of the current mirror circuit is not lower than a voltage where an output current is substantially constant. Due to the channel modulation effect, however, an output impedance of the current mirror circuit is reduced. Specifically, the output current after saturation increases with the voltage applied to the output of the current mirror circuit, resulting in a reduced current accuracy.

Further, in a conventional cascode current mirror circuit, where a gate-grounded transistor is inserted for cascode connection thereby to realize a high-output impedance, a low source voltage cannot be used. Namely, the conventional cascode current mirror circuit requires a high saturation voltage, and therefore, fails to meet the recent requirement for a lower voltage.

Therefore, in the conventional current mirror circuits, it is difficult to secure a high current accuracy and a low source voltage at the same time.

The prior art and the problem points thereof will be described in detail later with reference to the accompanying drawings.

SUMMARY OF THE INVENTION

An object of the present invention is to provide a current mirror circuit which is high in output impedance even with a low source voltage and for which a mirror ratio can be set with high accuracy.

According to the present invention, there is provided a current mirror circuit, having a plurality of field effect transistors, comprising a reference current source for supplying a reference current, an input circuit connected to the reference current source and supplied with the reference current, and at least one output circuit connected to the input circuit in a current mirror fashion, wherein the input circuit includes first and second input transistors connected in series with each other, gates of the first and second input transistors are both connected to a drain of the second input transistor, and the drain of the second input transistor is connected to the reference current source; the output circuit includes first and second output transistors connected in series with each other, a source of the first output transistor is connected to a source of the first input transistor, gates of the first and second output transistors are connected to the gates of the first and second input transistors, respectively, and an output current is produced from a drain of the second output transistor; and the second input transistor is operated with a voltage not higher than a threshold voltage of the first input transistor.

According to the present invention, there is also provided a current mirror circuit, having a plurality of field effect transistors, comprising a reference current source for supplying a reference current, an input circuit connected to the reference current source and supplied with the reference current, and at least one output circuit connected to the input circuit in a current mirror fashion, wherein the input circuit includes first, second and third input transistors connected in series with each other, a gate of the first input transistor is connected to a drain of the first input transistor, gates of the second and third input transistors are both connected to a drain of the third input transistor, and the drain of the third input transistor is connected to the reference current source; the output circuit includes first, second and third output transistors connected in series with each other, a source of the first output transistor is connected to a source of the first input transistor, a gate of the first output transistor is connected to the gate of the first input transistor, gates of the second and third output transistors are connected to the gates of the second and third input transistors, respectively, and an output current is produced from a drain of the third output transistor; and the third input transistor is operated with a voltage not higher than a threshold voltage of the second input transistor.

Further, according to the present invention, there is provided a current mirror circuit, having a plurality of field effect transistors, comprising a reference current source for supplying a reference current, an input circuit connected to the reference current source and supplied with the reference current, and at least one output circuit connected to the input circuit in a current mirror fashion, wherein the input circuit includes first, second and third input transistors connected in series with each other, a gate of the first input transistor is connected to a drain of the second input transistor, gates of the second and third input transistors are both connected to a drain of the third input transistor, and the drain of the third input transistor is connected to the reference current source; the output circuit includes first, second and third output transistors connected in series with each other, a source of the first output transistor is connected to the source of the first input transistor, a gate of the first output transistor is connected to the gate of the first input transistor, gates of the second and third output transistors are connected to the gates of the second and third input transistors, respectively, and an output current is produced from a drain of the third output transistor; and the third input transistor is operated with a voltage not higher than a threshold voltage of the second input transistor.

Further, according to the present invention, there is also provided a current mirror circuit, having a plurality of field effect transistors, comprising a reference current source for supplying a reference current, an input circuit connected to the reference current source and supplied with the reference current, and at least one output circuit connected to the input circuit in a current mirror fashion, wherein the input circuit includes first to Xth input transistors connected in series with each other, gates of Kth from the first to (X−2)th arbitrary input transistors are connected to a drain of (K+1)th input transistor, gates of the Xth and (X−1)th input transistors are both connected to a drain of the Xth input transistor, and the drain of the Xth input transistor is connected to the reference current source; the output circuit includes first to Xth output transistors connected in series with each other, a source of the first output transistor is connected to a source of the first input transistor, gates of Kth to (X−2)th arbitrary output transistors are connected to the gate of the Kth input transistor, gates of the Xth and (X−1)th output transistors are connected to the gates of the Xth and (X−1)th input transistors, respectively, and an output current is produced from a drain of the Xth output transistor; and the Xth input transistor is operated with a voltage not higher than a threshold voltage of the (X−1)th input transistor.

Shape ratios of a transistor in the input circuit and a corresponding transistor in each of the output circuits may be in a fixed relation with each other. The shape ratio of each of the transistors may be arbitrarily set for each of the output circuits. The current mirror circuit may be used as a power circuit for a semiconductor integrated circuit.

The reference current source may include a differential amplifier circuit, a current source circuit for receiving an output of the differential amplifier circuit, and a resistor connected in series with the current source circuit; and a reference voltage may be applied to a positive phase input of the differential amplifier circuit, a voltage at a junction node of the resistor and the current source circuit may be applied to a negative phase input of the differential amplifier circuit.

The current source circuit may include a current source transistor circuit having at least one field effect transistor; and the current source transistor circuit may include a first current source transistor, a source of the first current source transistor constitutes a reference terminal, a gate of the first current source transistor constitutes a current control terminal, and a drain of the first current source transistor constitutes an output terminal. The current source circuit may include a current source transistor circuit having at least one field effect transistor; and the current source transistor circuit may include first and second current source transistors connected in series with each other, a source of the first current source transistor may constitute a reference terminal, gates of the first and second current source transistors may constitute a current control terminal, a drain of the second current source transistor may constitute an output terminal, and the second current source transistor may be operated with a voltage not higher than a threshold voltage of the first current source transistor.

The second current source transistor may have a threshold voltage lower than a threshold voltage of the first current source transistor, the gates of which may be connected to each other. The second current source transistor may have substantially the same threshold voltage as the first current source transistor, the gates of which may be connected to each other, the second current source transistor being operated in a weak inversion region not higher than the threshold voltage thereof.

A selected one of the second to Xth input transistors may have a threshold voltage lower than a threshold voltage of a selected one of the first to (X−1)th input transistors, respectively, the gates of which may be connected to each other. A selected one of the second to Xth input transistors may have substantially the same threshold voltage as selected one of the first to (X−1)th input transistors, respectively, the gates of which may be connected to each other, the selected one of the second to Xth input transistors being operated in a weak inversion region not higher than the threshold voltage thereof.

According to the present invention, there is provided a current mirror circuit, having a plurality of field effect transistors, comprising a first reference current source for supplying a first reference current, a second reference current source for supplying a second reference current, an input circuit connected to the first and second reference current sources and supplied with the first and second reference currents, and at least one output circuit connected to the input circuit in a current mirror fashion, wherein the input circuit includes first and second input transistors connected in series with each other and third and fourth input transistors connected in series with each other, gates of the first and second input transistors are both connected to a drain of the second input transistor, the drain of the second input transistor is connected to the first reference current source, gates of the third and fourth input transistors are both connected to a drain of the fourth input transistor, and the drain of the fourth input transistor is connected to the second reference current source; the output circuit includes first and second output transistors connected in series with each other, a source of the first output transistor is connected to the sources of the first and third input transistors, a gate of the first output transistor is connected to the gates of the first and second input transistors, a gate of the second output transistor is connected to the gates of the third and fourth input transistors, and an output current is produced from a drain of the second output transistor; and the second input transistor is operated with a voltage not higher than a threshold voltage of the first input transistor, and the fourth input transistor is operated with a voltage not higher than a threshold voltage of the third input transistor.

According to the present invention, there is also provided a current mirror circuit, having a plurality of field effect transistors, comprising a first reference current source for supplying a first reference current, a second reference current source for supplying a second reference current, an input circuit connected to the first and second reference current sources and supplied with the first and second reference currents, and at least one output circuit connected to the input circuit in a current mirror fashion, wherein the input circuit includes first and second input transistors connected in series with each other and third and fourth input transistors connected in series with each other, a gate of the first input transistor is connected to a drain of the second input transistor, the drain of the second input transistor is connected to the first reference current source, gates of the second, third and fourth input transistors are connected to a drain of the fourth input transistor, and the drain of the fourth input transistor is connected to the second reference current source; the output circuit includes first and second output transistors connected in series with each other, a source of the first output transistor is connected to the sources of the first and third input transistors, a gate of the first output transistor is connected to the gate of the first input transistor, a gate of the second output transistor is connected to the gates of the second, third and fourth input transistors, and an output current is produced from a drain of the second output transistor; and the fourth input transistor is operated with a voltage not higher than a threshold voltage of the third input transistor.

Each of the first and second reference current sources may include a differential amplifier circuit, a current source circuit for receiving an output of the differential amplifier circuit, and a resistor connected in series with the current source circuit; and a reference voltage may be applied to a positive phase input of the differential amplifier circuit, a voltage at a junction node of the resistor and the current source circuit may be applied to a negative phase input of the differential amplifier circuit.

The current source circuit may include a current source transistor circuit having at least one field effect transistor; and the current source transistor circuit may include a first current source transistor, a source of the first current source transistor may constitute a reference terminal, a gate of the first current source transistor may constitute a current control terminal, and a drain of the first current source transistor may constitute an output terminal. The current source circuit may include a current source transistor circuit having at least one field effect transistor; and the current source transistor circuit may include first and second current source transistors connected in series with each other, a source of the first current source transistor may constitute a reference terminal, gates of the first and second current source transistors may constitute a current control terminal, a drain of the second current source transistor may constitute an output terminal, and the second current source transistor may be operated with a voltage not higher than a threshold voltage of the first current source transistor.

The second input transistor may have a threshold voltage lower than a threshold voltage of the first input transistor, the gates of the first and second input transistors may be connected to each other, and the fourth input transistor may have a threshold voltage lower than a threshold voltage of the third input transistor, the gates of the third and fourth input transistors may be connected to each other. The second input transistor may have substantially the same threshold voltage as the first input transistor, the gates of the first and second input transistors may be connected to each other, the second input transistor being operated in a weak inversion region not higher than the threshold voltage thereof, and the fourth input transistor may have substantially the same threshold voltage as the third input transistor, the gates of the third and fourth input transistors may be connected to each other, the fourth input transistor being operated in a weak inversion region not higher than the threshold voltage thereof.

In addition, according to the present invention, there is also provided a current mirror circuit comprising a reference current source and an input circuit connected in series between a first power line and a second power line, and at least one output circuit connected to the input circuit in a current mirror fashion, wherein the input circuit includes first and second input transistors connected in series with each other, gates of the first and second input transistors are connected to each other on one hand and connected to a junction node of a drain of the second input transistor and the reference current source on the other hand; and the second input transistor is operated with a voltage not higher than a threshold voltage of the first input transistor.

According to the present invention, there is provided a semiconductor integrated circuit having a power circuit constituted by a current mirror circuit having a plurality of field effect transistors, the current mirror circuit comprising a reference current source for supplying a reference current, an input circuit connected to the reference current source and supplied with the reference current, and at least one output circuit connected to the input circuit in a current mirror fashion, wherein the input circuit includes first and second input transistors connected in series with each other, gates of the first and second input transistors are both connected to a drain of the second input transistor, and the drain of the second input transistor is connected to the reference current source; the output circuit includes first and second output transistors connected in series with each other, a source of the first output transistor is connected to a source of the first input transistor, gates of the first and second output transistors are connected to the gates of the first and second input transistors, respectively, and an output current is produced from a drain of the second output transistor; and the second input transistor is operated with a voltage not higher than a threshold voltage of the first input transistor.

According to the present invention, there is also provided a semiconductor integrated circuit having a power circuit constituted by a current mirror circuit having a plurality of field effect transistors, the current mirror circuit comprising a reference current source for supplying a reference current, an input circuit connected to the reference current source and supplied with the reference current, and at least one output circuit connected to the input circuit in a current mirror fashion, wherein the input circuit includes first, second and third input transistors connected in series with each other, a gate of the first input transistor is connected to a drain of the first input transistor, gates of the second and third input transistors are both connected to a drain of the third input transistor, and the drain of the third input transistor is connected to the reference current source; the output circuit includes first, second and third output transistors connected in series with each other, a source of the first output transistor is connected to a source of the first input transistor, a gate of the first output transistor is connected to the gate of the first input transistor, gates of the second and third output transistors are connected to the gates of the second and third input transistors, respectively, and an output current is produced from a drain of the third output transistor; and the third input transistor is operated with a voltage not higher than a threshold voltage of the second input transistor.

Further, according to the present invention, there is provided a semiconductor integrated circuit having a power circuit constituted by a current mirror circuit having a plurality of field effect transistors, the current mirror circuit comprising a reference current source for supplying a reference current, an input circuit connected to the reference current source and supplied with the reference current, and at least one output circuit connected to the input circuit in a current mirror fashion, wherein the input circuit includes first, second and third input transistors connected in series with each other, a gate of the first input transistor is connected to a drain of the second input transistor, gates of the second and third input transistors are both connected to a drain of the third input transistor, and the drain of the third input transistor is connected to the reference current source; the output circuit includes first, second and third output transistors connected in series with each other, a source of the first output transistor is connected to the source of the first input transistor, a gate of the first output transistor is connected to the gate of the first input transistor, gates of the second and third output transistors are connected to the gates of the second and third input transistors, respectively, and an output current is produced from a drain of the third output transistor; and the third input transistor is operated with a voltage not higher than a threshold voltage of the second input transistor.

Further, according to the present invention, there is also provided a semiconductor integrated circuit having a power circuit constituted by a current mirror circuit having a plurality of field effect transistors, the current mirror circuit comprising a reference current source for supplying a reference current, an input circuit connected to the reference current source and supplied with the reference current, and at least one output circuit connected to the input circuit in a current mirror fashion, wherein the input circuit includes first to Xth input transistors connected in series with each other, gates of Kth from the first to (X−2)th arbitrary input transistors are connected to a drain of (K+1)th input transistor, gates of the Xth and (X−1)th input transistors are both connected to a drain of the Xth input transistor, and the drain of the Xth input transistor is connected to the reference current source; the output circuit includes first to Xth output transistors connected in series with each other, a source of the first output transistor is connected to a source of the first input transistor, gates of Kth to (X−2)th arbitrary output transistors are connected to the gate of the Kth input transistor, gates of the Xth and (X−1)th output transistors are connected to the gates of the Xth and (X−1)th input transistors, respectively, and an output current is produced from a drain of the Xth output transistor; and the Xth input transistor is operated with a voltage not higher than a threshold voltage of the (X−1)th input transistor.

According to the present invention, there is provided a semiconductor integrated circuit having a power circuit constituted by a current mirror circuit having a plurality of field effect transistors, the current mirror circuit comprising a first reference current source for supplying a first reference current, a second reference current source for supplying a second reference current, an input circuit connected to the first and second reference current sources and supplied with the first and second reference currents, and at least one output circuit connected to the input circuit in a current mirror fashion, wherein the input circuit includes first and second input transistors connected in series with each other and third and fourth input transistors connected in series with each other, gates of the first and second input transistors are both connected to a drain of the second input transistor, the drain of the second input transistor is connected to the first reference current source, gates of the third and fourth input transistors are both connected to a drain of the fourth input transistor, and the drain of the fourth input transistor is connected to the second reference current source; the output circuit includes first and second output transistors connected in series with each other, a source of the first output transistor is connected to the sources of the first and third input transistors, a gate of the first output transistor is connected to the gates of the first and second input transistors, a gate of the second output transistor is connected to the gates of the third and fourth input transistors, and an output current is produced from a drain of the second output transistor; and the second input transistor is operated with a voltage not higher than a threshold voltage of the first input transistor, and the fourth input transistor is operated with a voltage not higher than a threshold voltage of the third input transistor.

According to the present invention, there is also provided a semiconductor integrated circuit having a power circuit constituted by a current mirror circuit having a plurality of field effect transistors, the current mirror circuit comprising a first reference current source for supplying a first reference current, a second reference current source for supplying a second reference current, an input circuit connected to the first and second reference current sources and supplied with the first and second reference currents, and at least one output circuit connected to the input circuit in a current mirror fashion, wherein the input circuit includes first and second input transistors connected in series with each other and third and fourth input transistors connected in series with each other, a gate of the first input transistor is connected to a drain of the second input transistor, the drain of the second input transistor is connected to the first reference current source, gates of the second, third and fourth input transistors are connected to a drain of the fourth input transistor, and the drain of the fourth input transistor is connected to the second reference current source; the output circuit includes first and second output transistors connected in series with each other, a source of the first output transistor is connected to the sources of the first and third input transistors, a gate of the first output transistor is connected to the gate of the first input transistor, a gate of the second output transistor is connected to the gates of the second, third and fourth input transistors, and an output current is produced from a drain of the second output transistor; and the fourth input transistor is operated with a voltage not higher than a threshold voltage of the third input transistor.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

A conventional current mirror circuit and the problem points thereof will be explained prior to the description of embodiments of the invention.

Figure 1:
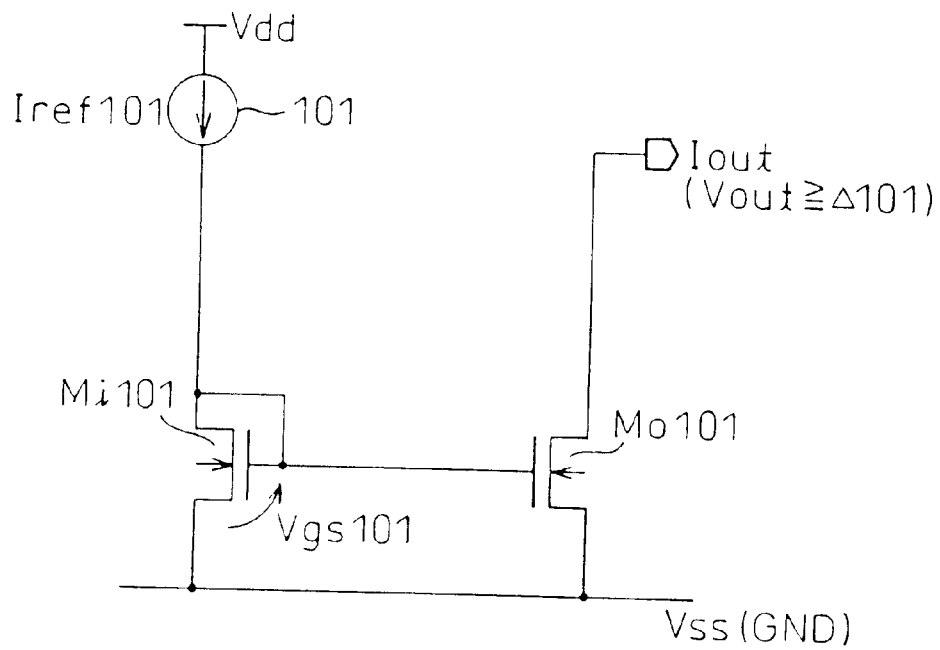
FIG. 1 is a circuit diagram showing an example of a conventional current mirror circuit.
Figure 2:
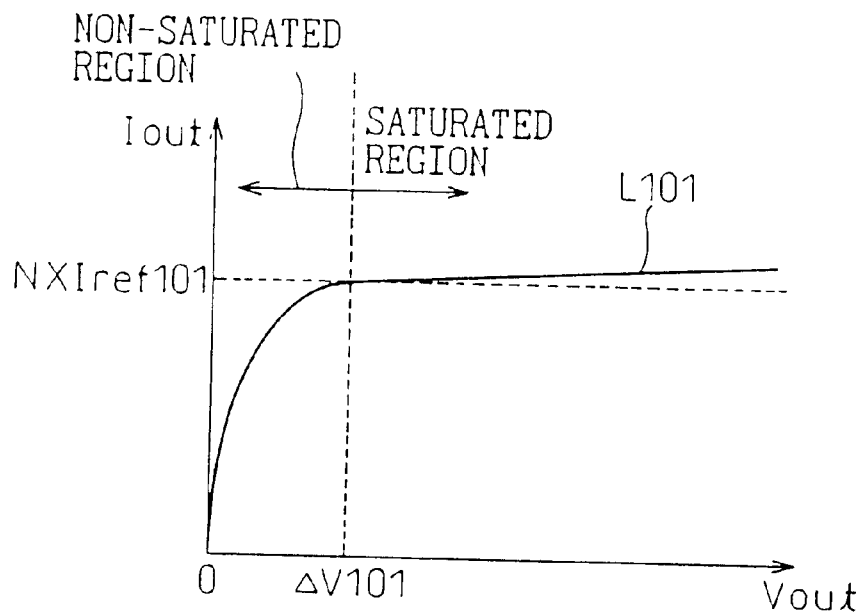
FIG. 2 is a diagram for explaining the operation of the current mirror circuit of FIG. 1.

FIG. 1 is a circuit diagram showing an example of a conventional current mirror circuit, and FIG. 2 is a diagram for explaining the operation of the current mirror circuit of FIG. 1.

As shown in FIG. 1, the conventional current mirror circuit comprises, for example, a reference current source 101 for supplying a reference current Iref101, an input circuit including a n-channel MOS transistor (nMOS transistor) Mi101 and an output circuit including a nMOS transistor Mo101.

The sources of the transistors Mi101, Mo101 and the gates of the transistors Mi101, Mo101 are connected to each other, respectively. Also, the drain of the transistor Mi101 is connected to the gate of the transistor Mi101. The drain of the transistor Mi101 is connected to the reference current source 101, so that the reference current Iref101 flows in the transistor Mi101. Further, the drain of the transistor Mo101 constitutes a terminal from which an output current Iout is produced. The shape ratios (given by the ratio of gate width to gate length) of the transistor Mi101 and the transistor Mo101 are in such a proportional relation with each other that one is larger than the other by a factor of N (=0.1 to 10). Specifically, assuming that the gate width and the gate length of the transistor Mi101 are W101 and L101, respectively, the shape ratio Sro101 of the transistor Mo101 is given as N×W101/L1O1, so that a required output current Iout (=N×Iref101) can be produced.

As shown in FIG. 2, the transistor Mo101 in the conventional current mirror circuit of FIG. 1 is saturated when the voltage Vout applied to the output thereof is not lower than $\Delta V101$ (say, 0.2 V), in which case the output current Iout is substantially constant at N×Iref.

Due to the channel modulation effect, however, the output impedance of the current mirror circuit shown in FIG. 1 is reduced. Specifically, the output current Iout after saturation increases with the voltage Vout applied to the output, resulting in a reduced current accuracy.

Figure 3:
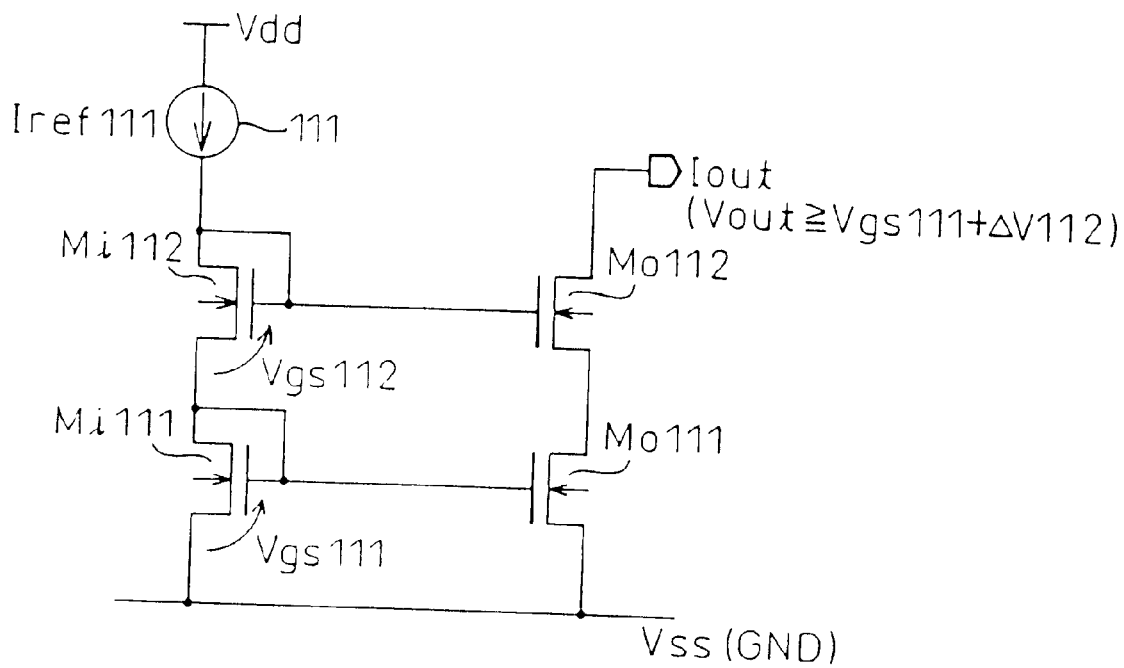
FIG. 3 is a circuit diagram showing another example of a conventional current mirror circuit.
Figure 4:
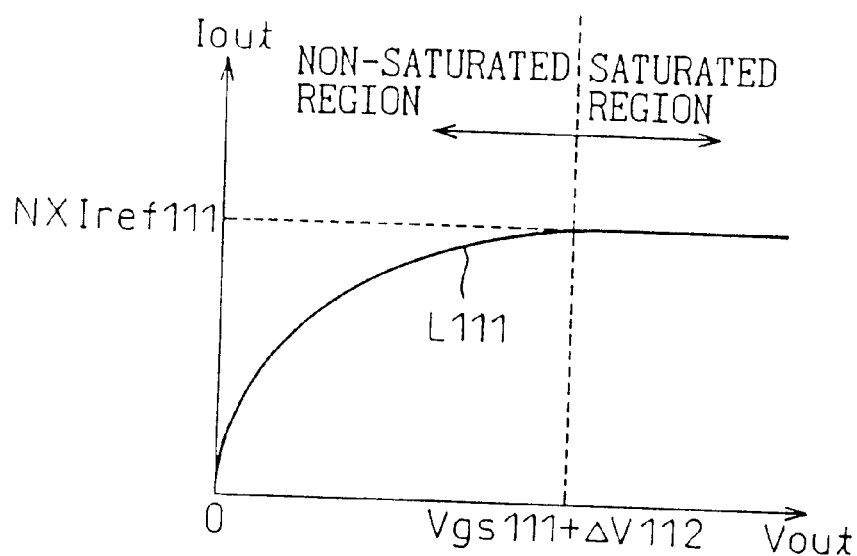
FIG. 4 is a diagram for explaining the operation of the current mirror circuit of FIG. 3.

FIG. 3 is a circuit diagram showing another example of a conventional current mirror circuit, and FIG. 4 is a diagram for explaining the operation of the current mirror circuit shown in FIG. 3.

The current mirror circuit shown in FIG. 3 is a cascode current mirror circuit, and is equivalent to the current mirror circuit of FIG. 1 into which a gate-grounded transistor is inserted for cascode connection thereby to realize a high-output impedance.

Specifically, as shown in FIG. 3, a cascode current mirror circuit includes a reference current source 111 for supplying a reference current Iref111, an input circuit having two nMOS transistors Mi111, Mi112 connected in series with the reference current source 111, and an output circuit having two nMOS transistors Mo111, Mo112 connected in series with each other.

The sources of the transistors Mi111, Mo111, the gates of the transistors Mi111, Mo111 and the gates of the transistors Mi112, Mo112 are connected to each other, respectively. Further, the drain of the transistor Mi111 is connected to the gate of the transistor Mi111, and the drain of the transistor Mi112 is connected to the gate of the transistor Mi112. The drain of the transistor Mi112 is connected to the reference current source 111, so that a reference current Iref111 flows in the transistors Mi111, Mi112. The drain of the transistor Mo112 makes up a terminal for producing the output current Iout. The shape ratios (given as the ratio of gate width to gate length) of the transistors Mi111 and the transistor Mo111 are in such a proportional relation with each other that one is larger than the other by a factor of N. So are the shape ratios of the transistor Mi112 and the transistor Mo112. Specifically, assuming that the gate width and the gate length of the transistor Mi111 are W111, L111, respectively, the shape ratio Sro111 of the transistor Mo111 is expressed as Sro111 =N×W111/L111. Also, assuming that the gate width and the gate length of the transistor Mi112 are W112, L112, respectively, the shape ratio of the transistor Sro112 is given as Sro112=N×W112/L112. Thus, the required output current Iout (=N×Iref111) can be produced.

As shown in FIG. 4, assuming in the conventional current mirror circuit of FIG. 3 that the gate-source voltage of the transistor Mi112 is Vgs111, a high voltage of not lower than Vgs111+$\Delta$V112 (say, 0.8 V'0.2 V=1.0 V) is required as a voltage Vout applied to the output of the transistor Mo112. Therefore, the conventional mirror circuit cannot be used with a low source voltage. $\Delta V112$ designates a saturation voltage of the transistor Mo112.

Figure 5A:
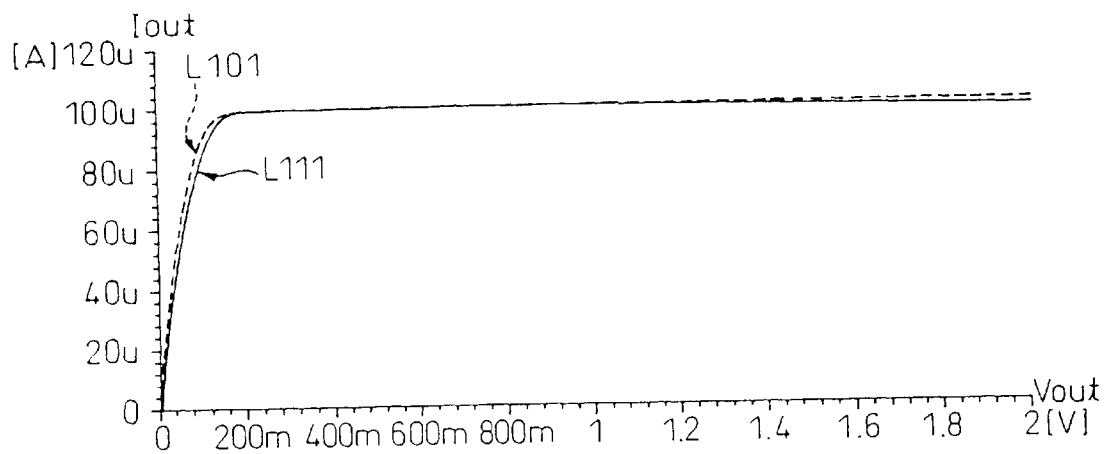
FIGS. 5A and 5B are diagrams showing the result of simulation of the conventional current mirror circuits shown in FIGS. 1 and 3.
Figure 5B:
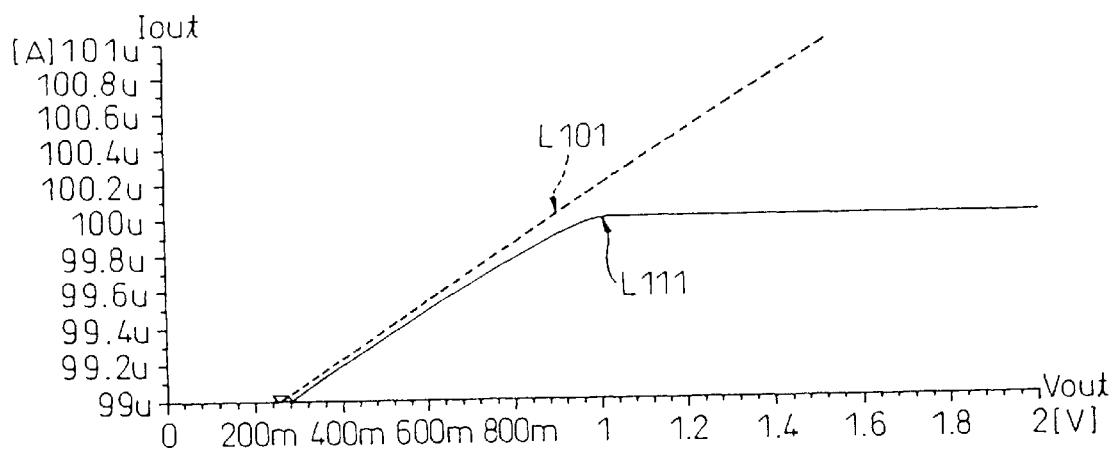

FIGS. 5A and 5B are diagrams showing the result of simulation of the conventional current mirror circuits of FIGS. 1 and 3, respectively. These diagrams correspond to the characteristic curve L101 of FIG. 2 and the characteristic curve L111 of FIG. 4, respectively. The value of Iref is 100 $\mu$A. In FIG. 5A, the ordinate represents Iout in the range of 0 ampere (A) to 120 microamperes ($\mu$A, $\mu$A), and the abscissa represents Vout in the range of 0 to 2 volts (V). Also, in FIG. 5B, the ordinate represents Iout in the range of 99 $\mu$A to 101 $\mu$A, and the abscissa Vout in the range of 0 V to 2 V. Specifically, FIG. 5B is an enlarged view of a part of FIG. 5A (Iout in the range of 99 $\mu$A to 101 $\mu$A).

As seen from the characteristic curve L101 of FIG. 5B, the conventional current mirror circuit shown in FIG. 1 is such that the output current Iout increases with the output voltage Vout even after saturation (say, over 0.2 V), for a reduced current accuracy. Also, as apparent from the characteristic curve L111 of FIG. 5B, the conventional current mirror circuit shown in FIG. 3 is such that the output current Iout after saturation remains constant in spite of the increase in the output voltage Vout, thereby making it possible to secure a sufficient current accuracy. The current mirror circuit in FIG. 3, however, requires a high saturation voltage (1.0 V, for example). This conventional circuit, therefore, fails to meet the recent requirement for a lower voltage, and the use thereof with actual circuits has posed a problem.

As described above, with the conventional current mirror circuits, it is difficult to secure a high current accuracy and a low source voltage at the same time. Also, the above-mentioned channel modulation effect has become more conspicuous as the channel has been shortened in recent years. This tends to deteriorate the current accuracy even more. Further, a transistor with a short channel has a low breakdown voltage. For realizing a high current accuracy and a low power consumption, therefore, the source voltage is reduced even more. For this reason, demand is increasing for a current mirror circuit which can realize both a high current accuracy and a low source voltage at the same time.

Each embodiment of a current mirror circuit according to the invention will be described below with reference to the accompanying drawings.

Figure 6:
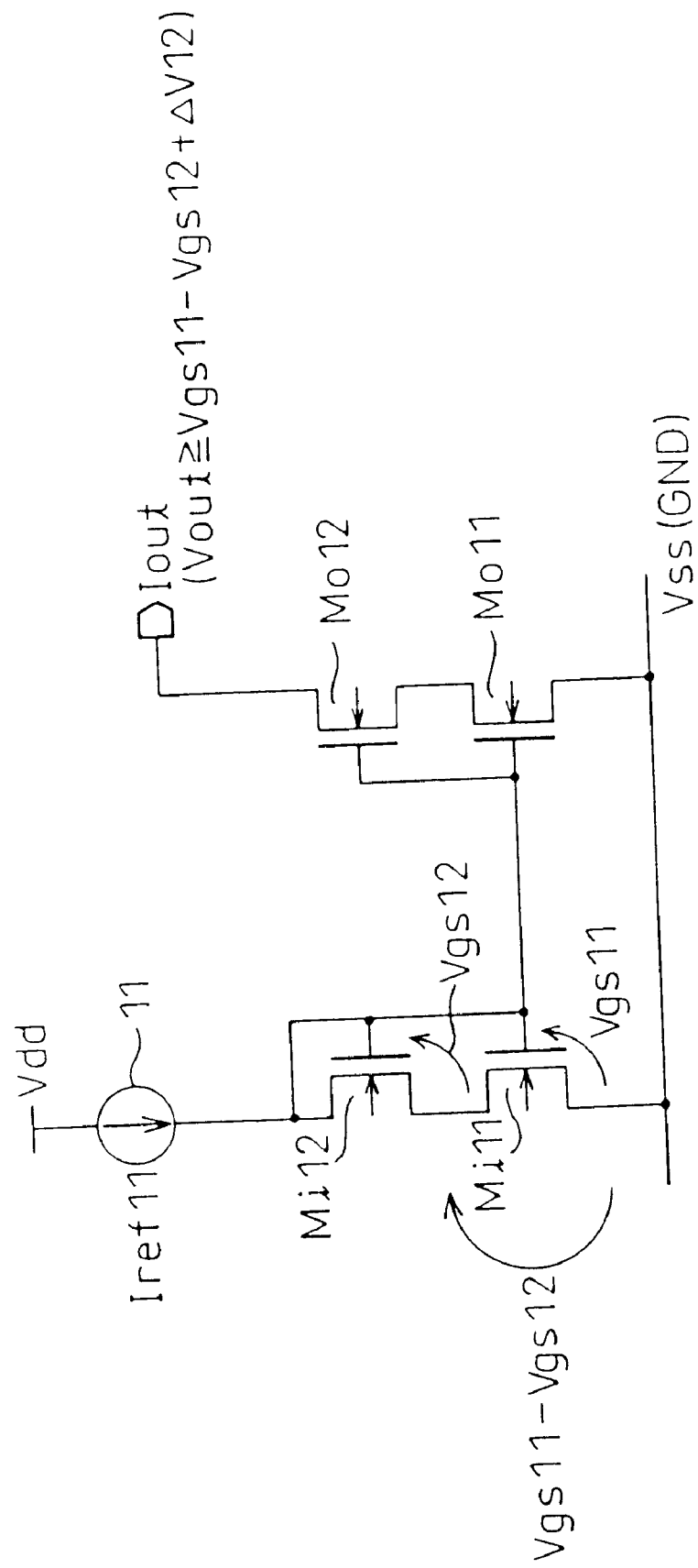
FIG. 6 is a circuit diagram showing a first embodiment of the current mirror circuit according to the invention.
Figure 7:
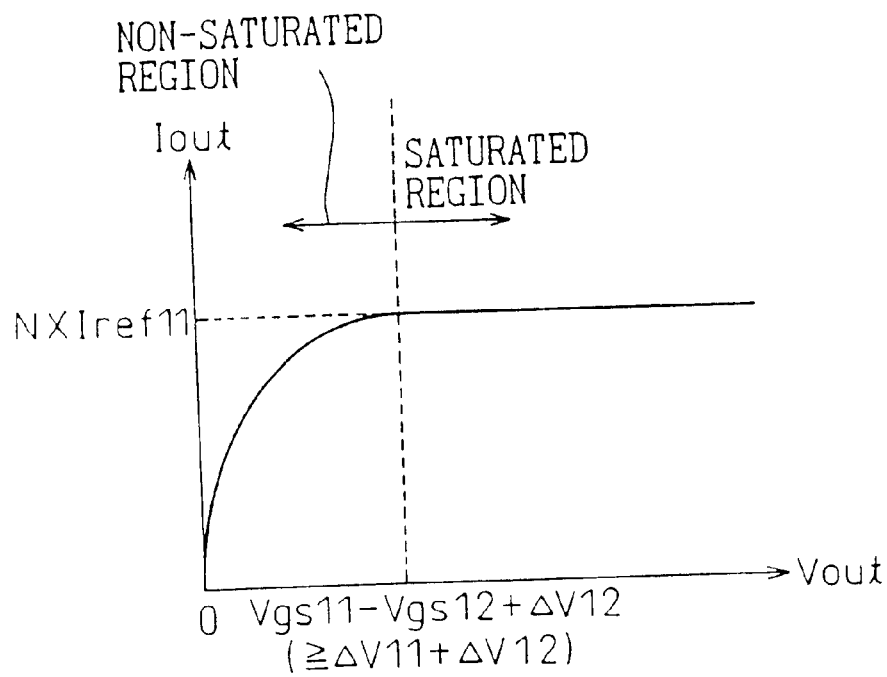
FIG. 7 is a diagram for explaining the operation of the current mirror circuit of FIG. 6.

FIG. 6 is a circuit diagram showing a current mirror circuit according to an embodiment of the invention, and FIG. 7 is a diagram for explaining the operation of the current mirror circuit of FIG. 6.

As shown in FIG. 6, the current mirror circuit according to the first embodiment is a cascode current mirror circuit comprising a reference current source 11 for supplying a reference current Iref11, an input circuit including two n-channel MOS transistors (nMOS transistors) Mi11, Mi12 connected in series with the reference current source 11 and an output circuit including two RMOS transistors Mo11, Mi11 connected in series with each other. The sources of the transistors Mi11, Mo11 and the gates of the transistors Mi11, Mi12 and Mo11, Mo12 are connected to each other, respectively. The drain of the transistor Mi12 is connected to the gates of the transistors Mi11, Mi12 (Mo11, Mo12) and the reference current source 11.

As a result, the reference current Iref11 flows in the transistors Mi11 and Mi12. The drain of the transistor Mo12 constitutes a terminal from which an output current Iout is produced. The shape ratios (given as the ratio of gate width to gate length) of the transistors Mi11 and Mo11 are in such a proportional relation with each other that one is larger than the other by a factor of N. So are the shape ratios of the transistors Mi12 and Mo12. Specifically, assuming that the gate width and the gate length of the transistor Mi11 are W11 and L11, respectively, the shape ratio Sro11 of the transistor Mo11 is given as Sro11=N×W11/L11. Assuming that the gate width and the gate length of the transistor Mi12 are W12 and L12, on the other than, the shape ratio Srol2 of the transistor Mo12 is Srol2=N×W12/L12. Thus, the required output current Iout (=N×Iref11) can be produced.

In this way, the current mirror circuit according to the first embodiment is such that the gates of the transistors Mi11, Mi12 connected in series with each other are connected to the drain of the transistor Mi12, and the transistor Mi12 is operating the gate-source voltage Vgsl2 thereof at a level not higher than the threshold voltage Vth of the transistor Mi11. Specifically, the transistor Mi12 is operated at a voltage not higher than the threshold voltage Vth11 of the transistor Mi11. The transistors Mo11 and Mo12 are connected in cascode to each other, and the transistor Mo12 operates as a gate-grounded transistor.

The transistor Mi12 is operated accurately in the saturation region. When the transistor Mi11 enters the non-saturation region, however, the output impedance of this transistor Mi11 considerably drops. Even a cascode connection, therefore, cannot produce a high output impedance. For a high-accuracy current mirror circuit to be realized, therefore, it is necessary to turn on the transistor Mi11 in the saturation region (see FIG. 7).

In the current mirror circuit according to the first embodiment shown in FIG. 6, assume that the gate-source voltages of the transistors Mi11, Mi12 are Vgs11 and Vgs12, respectively. The drain voltage of the transistor Mi11 is given as Vgs11–Vgs12. Also, the saturation voltage ΔV11 of the transistor Mi11 is expressed as $$\Delta V11 = Vgs11 - Vth11$$

For the transistor Mi11 to operate in the saturation region, therefore, the following conditions are required to be met.

$$Vgs11 - Vgs12 \geq Vgs11 - Vth11$$

i.e.

$$Vgs12 \geq Vth11$$

This indicates that if the gate-source voltage Vgs12 of the transistor Mi12 is not higher than the threshold voltage Vth11 of the transistor Mi11, both the transistors Mi11 and Mi12 can be operated in the saturation region.

Specifically, the two following-described techniques, for example, are available for operating a current mirror circuit (transistor Mi12) with the gate-source voltage Vgs12 of the transistor Mi12 not higher than the threshold voltage Vth11 of the transistor Mi11.

In a first technique, the threshold voltage Vth12 of the transistor Mi12 is set to a level not higher than the threshold voltage Vth11 of the transistor Mi11. The threshold voltage Vth of the MOS transistor can be controlled according to the charge of the channel. Thus, two or more threshold voltages of transistors are secured using a multi-threshold fabrication process, so that the transistor Mi12 is configured of a transistor of low threshold voltage, while the transistor Mi11 is constituted of a transistor of high threshold voltage.

A second technique operates the transistor Mi12 in a weak inversion region. In this weak inversion region, the drain current Id can be supplied even for the threshold voltage of not higher than Vth.

As shown in FIG. 7, the transistors Mo11, Mo12 in the current mirror circuit according to the first embodiment reach saturation when the voltage Vout applied to the output thereof is not lower than Vgs11–Vgsl2+ΔV12 (say, 0.4 V), and the output current Iout becomes substantially constant at N×Iref11.

The back gate of each transistor is connected to the ground (GND: Vss). If the back gate is connected to the source of each transistor, however, the effect of the substrate bias is eliminated, thereby making it possible to operate the transistors at an even lower voltage. Although the embodiments of the invention use a n-channel MOS transistor, it is possible to use a p-channel MOS transistor or a field effect transistor (FET) other than the MOS transistor with equal effect.

Figure 8:
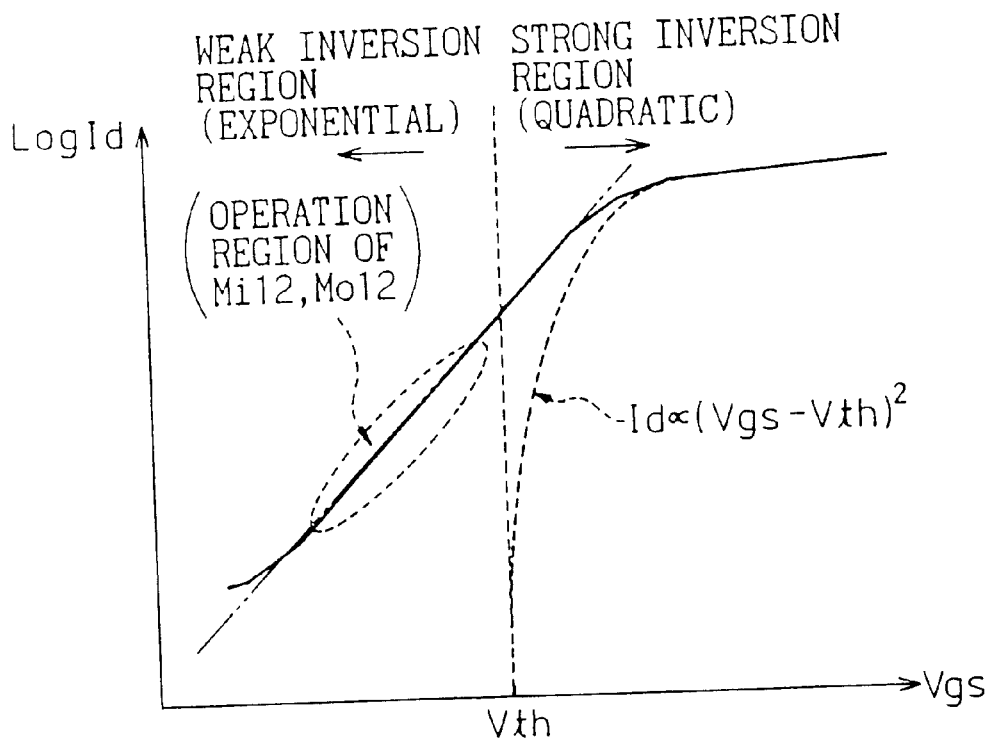
FIG. 8 is a diagram showing the characteristics of a MOS transistor used for a current mirror circuit according to the invention.

FIG. 8 is a diagram showing the characteristics of the MOS transistor used with a current mirror circuit according to the invention.

The MOS transistor is known to have a Vgs-Id characteristic as shown in FIG. 8 and as described in detail in "OPERATION AND MODELING OF THE MOS TRANSISTOR", by Yannis P. Tsividis. Normally, in the strong inversion area of not lower than the threshold voltage Vth, the Vgs-Id characteristic exhibits a quadratic function. Assuming that the gate width and the gate length of the transistor are W and L, respectively, the drain current Id is given as $$Id = (W/L) \times (k'/2) \times (Vgs - Vth)^2$$

where k' is a process coefficient.

In the weak inversion region of not higher than the threshold voltage Vth, on the other hand, the Vgs-Id characteristic exhibits an exponential function, and Id is given by the equation described below.

$$Id = (W/L) \times Ix \times \exp((Vgs - Vx)/N\phi t)$$

where Vx corresponding to the threshold voltage for the weak inversion region is given as Vx<Vth, and Ix, Vx and nφT are predetermined constants.

The current density in the weak inversion region is such that a giant transistor has so far been required for supplying a sufficient current. With the recent trend toward a shorter channel, however a sufficient current can now be supplied even with the MOS transistor of normal size, whereby a positive utilization of the weak inversion region has become possible.

Specifically, the weak inversion region can be positively used by setting the gate length to 0.5 μm (μm) or less, for example.

As described above, in the current mirror circuit according to the first embodiment of the invention, nMOS transistors Mi11 and Mi12 with the gates thereof connected to each other are connected in series with each other and both are operated in the saturation region, thereby making it possible to produce a high output impedance. Also, the voltage at which the output circuit configured of the transistors Mo11 and Mo12 reaches a saturation is given as [Vgs11−Vgs12+ΔV12]. By setting the voltage [Vgs11−Vgs12] to a value near to the saturation voltage ΔV11 of the transistor Mo11, the current mirror circuit can be operated with the output voltage Vout set to a low value of about 0.4 V.

As a result, a current mirror circuit can be provided which is capable of low-voltage operation while maintaining a high current accuracy.

Figure 9:
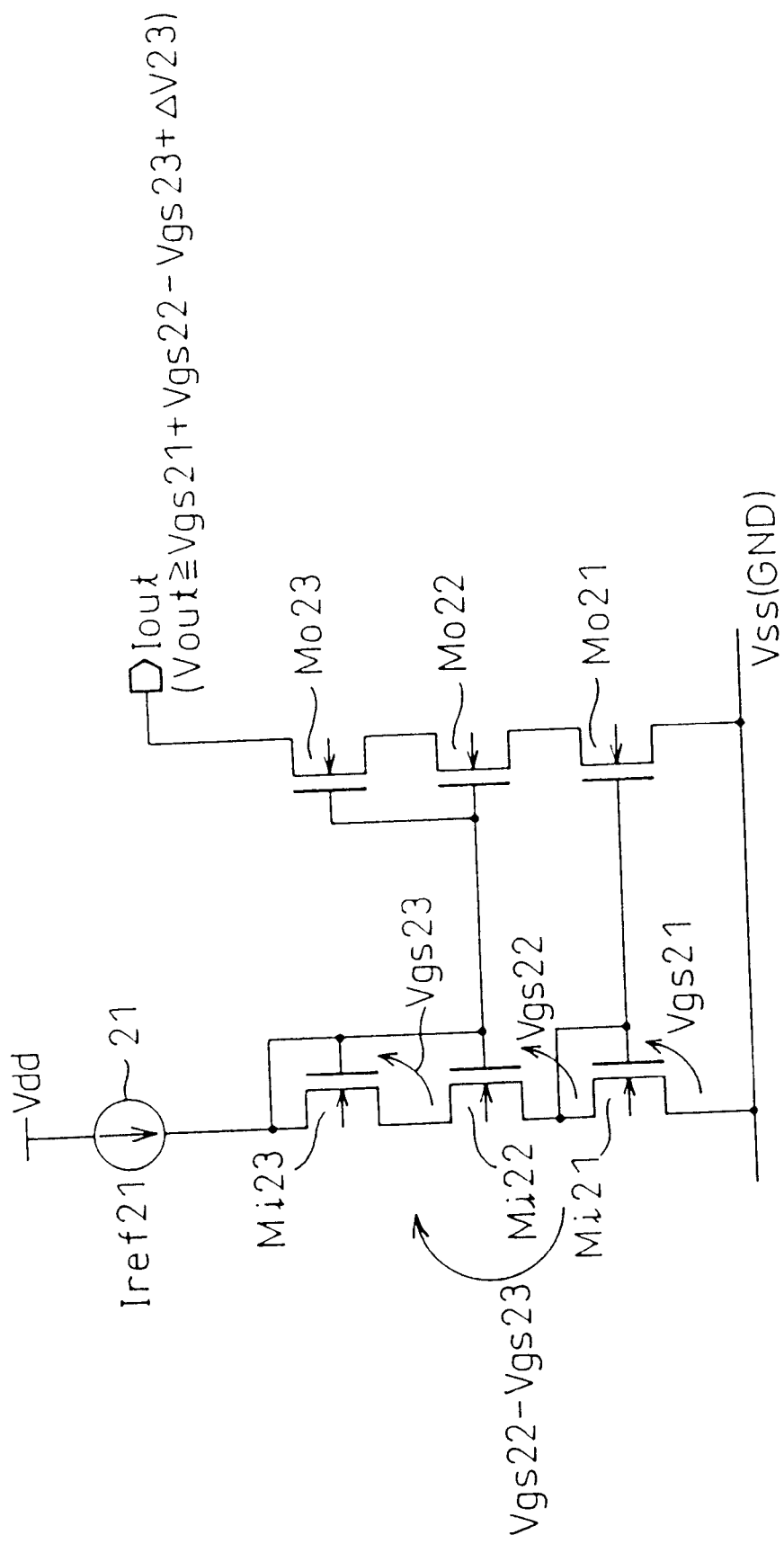
FIG. 9 is a circuit diagram showing a second embodiment of the current mirror circuit according to the invention.

FIG. 9 is a circuit diagram showing a current mirror circuit according to a second embodiment of the invention. This current mirror circuit is configured in a triple cascode connection. With the triple cascode current mirror circuit according to this second embodiment, as compared with the first embodiment shown in FIG. 6, the mirror ratio can be set with higher accuracy for a higher operation voltage.

As shown in FIG. 9, the triple cascode current mirror circuit according to the second embodiment comprises a reference current source 21 for supplying a reference current Iref21, an input circuit including three nMOS transistors Mi21, Mi22, Mi23 connected in series with the reference current source 21 and an output circuit including three nMOS transistors Mo21, Mo22, Mo23 connected in series with each other. The sources of the transistors Mi21, Mo21, the gates of the transistors Mi21, Mo21 and the gates of the transistors Mi22, Mi23 and Mo22, Mo23 are connected to each other, respectively. The drain of the transistor Mi21 (the source of the transistor Mi22) is connected to the gate of the transistor Mi21 (Mo21), and the drain of the transistor Mi23 is connected to the gates of the transistors Mi22, Mi23 (Mo22, Mo23) and the reference current source 21.

It follows therefore that the reference current Iref21 flows in the transistors Mi21, Mi22, Mi23. The drain of the transistor Mo23 provides a terminal from which the output current Iout is produced. The shape ratios (given as the ratio of gate width to gate length) of the transistors Mi21 and Mo21, the shape ratios of the transistors Mi22 and Mo22, and the shape ratios of the transistors Mi23 and Mo23 are in such a proportional relationship that one shape ratio is larger than the other shape ratio by a factor of N in each transistor couple.

Specifically, assuming the gate width and the gate length of the transistor Mi21 are W21 and L21, respectively, the shape ratio Sro21 of the transistor Mo21 is given as Sro21=N×W21/L21. Also, assuming that the gate width and the gate length of the transistor Mi22 are W22 and L22, the shape ratio Sro22 of the transistor Mo22 is given as Sro22=N×W22/L22. Further, when the gate width and the gate length of the transistor Mi23 are W23 and L23, respectively, the shape ratio Sro23 of the transistor Mo23 is given as Sro23=N×W23/L23. As a result, the required output current Iout (=N×Iref21) can be produced.

The current mirror circuit according to the second embodiment, like the first embodiment described above, is operated with the gate-source voltage Vgs23 of the transistor Mi23 not higher than the threshold voltage Vth22 of the transistor Mi22. In other words, the transistor Mi23 is operated with a voltage not higher than the threshold voltage Mth22 of the transistor Mi22. Also, the transistors Mo21, Mo22, Mo23 are saturated when the voltage Vout applied to the output thereof is not lower than Vgs21+Vgs22×Vgs23+ΔV23 (say, 1.2 V), and the output current becomes substantially constant at N×Iref21. According to the second embodiment, the mirror ratio (output current Iout) can be set with higher accuracy than in the first embodiment described above.

In the second embodiment (or in each of the embodiments described below), the back gate of each transistor is connected to the ground. If it is connected to the source of each transistor, however, the substrate bias effect is eliminated and the operation with an even lower voltage is made possible. Also, as described above, instead of a n-channel MOS transistor used in each embodiment of the invention, a p-channel MOS transistor or a field effect transistor other than the MOS transistor can be used with equal effect.

Figure 10:
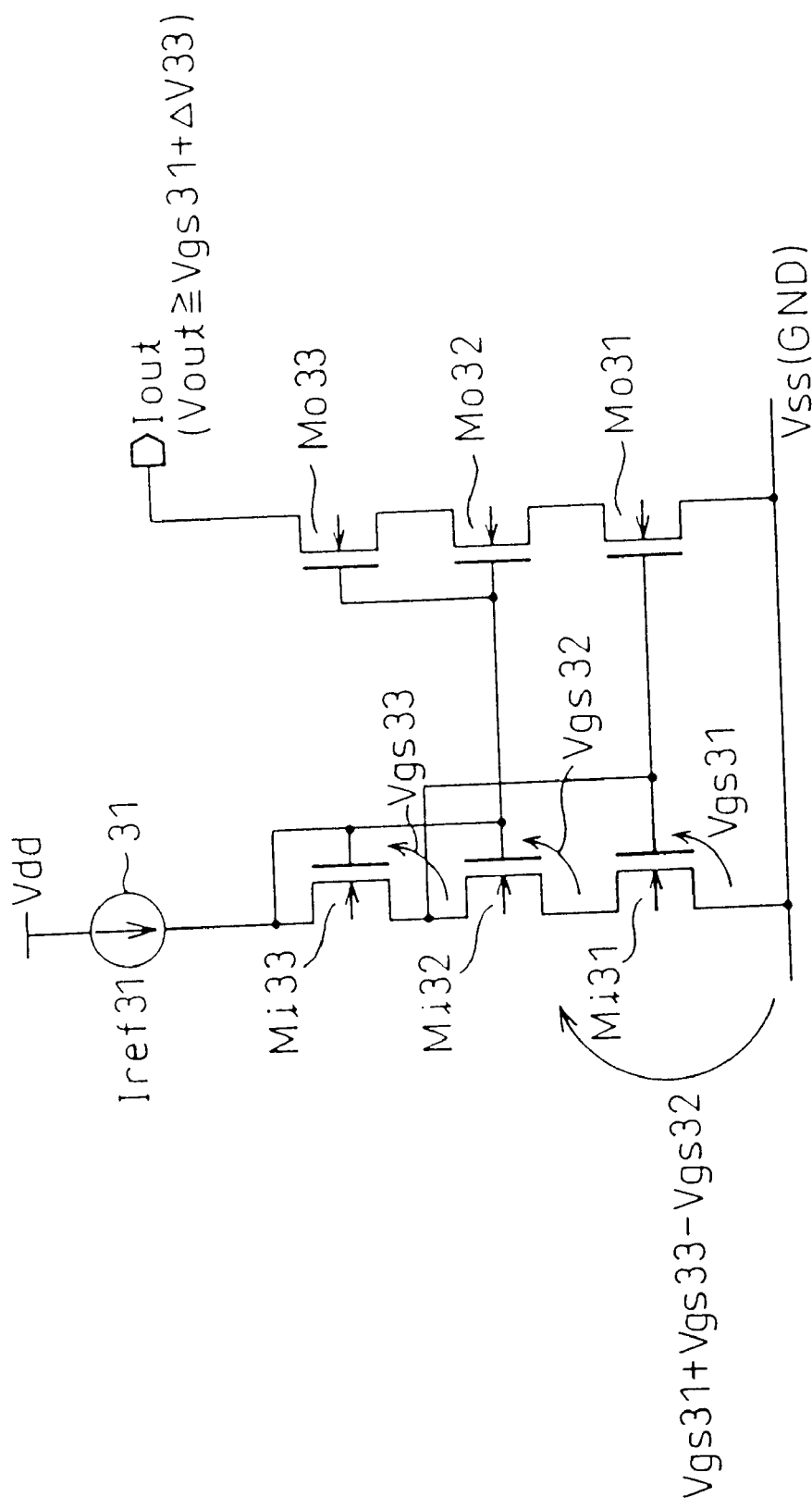
FIG. 10 is a circuit diagram showing a third embodiment of the current mirror circuit according to the invention.

FIG. 10 is a circuit diagram showing a current mirror circuit according to a third embodiment of the invention, which improves the operation voltage increase included in the current mirror circuit according to the second embodiment shown in FIG. 9.

As shown in FIG. 10, the current mirror circuit according to the third embodiment, like in the second embodiment described above, constitutes a current mirror circuit in triple cascode connection. Comparison between FIGS. 9 and 10 shows that in the third embodiment the gates of the transistors Mi31, Mo31 (Mi21, Mo21) are connected not to the drain of the transistor Mi31 (Mi21) but to the drain of the transistor Mi32 (Mi22). The remaining configuration is similar to the corresponding configuration of the second embodiment described above and will not be described. In this third embodiment, the accuracy (set accuracy of the mirror ratio) of the current mirror circuit is substantially the same as that of the second embodiment.

The current mirror circuit according to the third embodiment, like that of the second embodiment described above, is operated with the gate-source voltage Vgs33 of the transistor Mi33 not higher than the threshold voltage Vth32 of the transistor Mi32. Also, the transistors Mo31, Mo32, Mo33 are saturated when the voltage Vout applied to the output thereof is not lower than Vgs31+ΔV33 (say, 1.0 V), wherefrom the output current Iout is substantially constant at N×Iref31. In this way, according to the third embodiment, the operation voltage can be lowered more than in the second embodiment described above. Both the second and third embodiments can of course be configured of a current mirror circuit in quadruple or more cascode connection. This multiple cascode connection can further improve the circuit accuracy. The resultant higher operation voltage, however, makes a current mirror circuit in a double or a triple cascode connection a practically desirable choice.

Figure 11A:
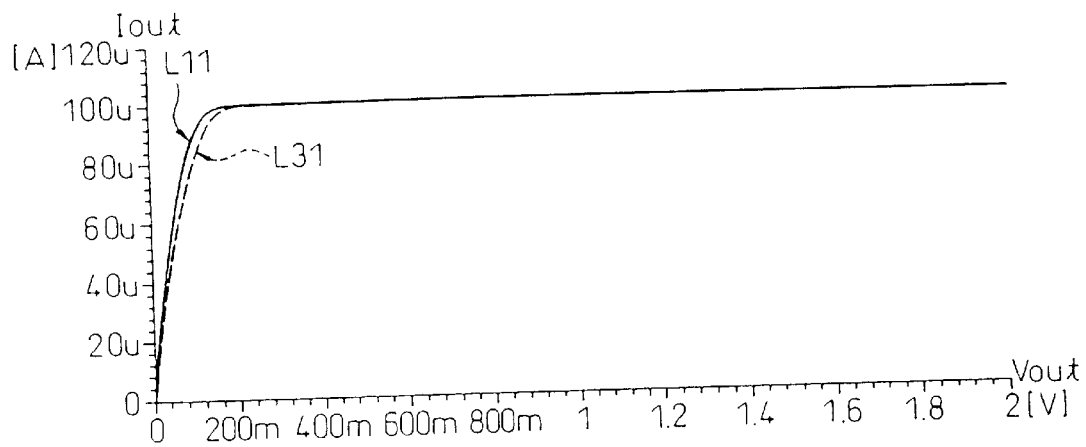
FIGS. 11A and 11B are diagrams showing the result of simulation of the current mirror circuits according to the first and third embodiments shown in FIGS. 6 and 10, respectively.
Figure 11B:
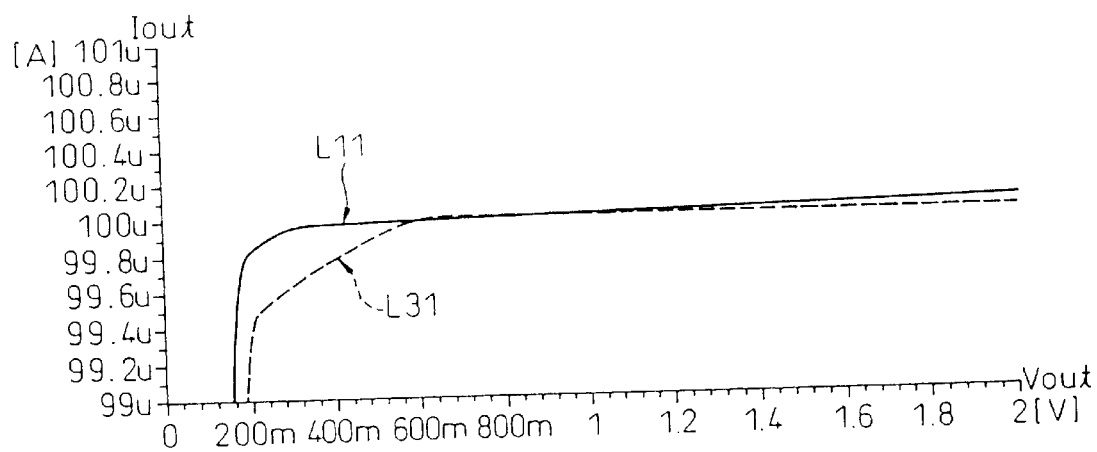

FIGS. 11A and 11B are diagrams showing the result of simulation of the current mirror circuits according to the first and third embodiments shown in FIGS. 6 and 10, respectively. The value of Iref is 100 μA. In FIG. 11A, the ordinate represents Iout in the range of 0 ampere (A) to 120 microamperes (μA or μA), and the abscissa represents Vout in the range of 0 volt (V) to 2 V. In FIG. 11B, on the other hand, the ordinate represents Iout in the range of 99 μA to 101 μA, and the abscissa represents Vout in the range of 0 V to 2 V. Specifically, FIG. 11B is an enlarged view of a part (Iout in the range of 99 μA to 101 μA) of FIG. 11A. In FIGS. 11A and 11B, reference numeral L11 designates the characteristic curve of the current mirror circuit according to the first embodiment, and L31 designates the characteristic curve of the current mirror circuit according to the third embodiment.

As seen from the characteristic curve L11 of FIG. 11B, the current mirror circuit according to the first embodiment of the invention shown in FIG. 6 produces an output current Iout which slightly increases but remains substantially constant with the output voltage Vout after saturation (over 0.4 V, for example).

Further, as apparent from the characteristic curve L31 of FIG. 11B, the current mirror circuit according to the third embodiment of the invention shown in FIG. 10 produces an output current Iout which assumes a constant value in spite of the increase in the output voltage Vout after saturation (over 0.6 V, for example). In this way, in each embodiment of the current mirror circuit according to the invention, the output impedance can be increased even with a low source voltage, and the mirror ratio can be set with a high accuracy at the same time.

Figure 12A:
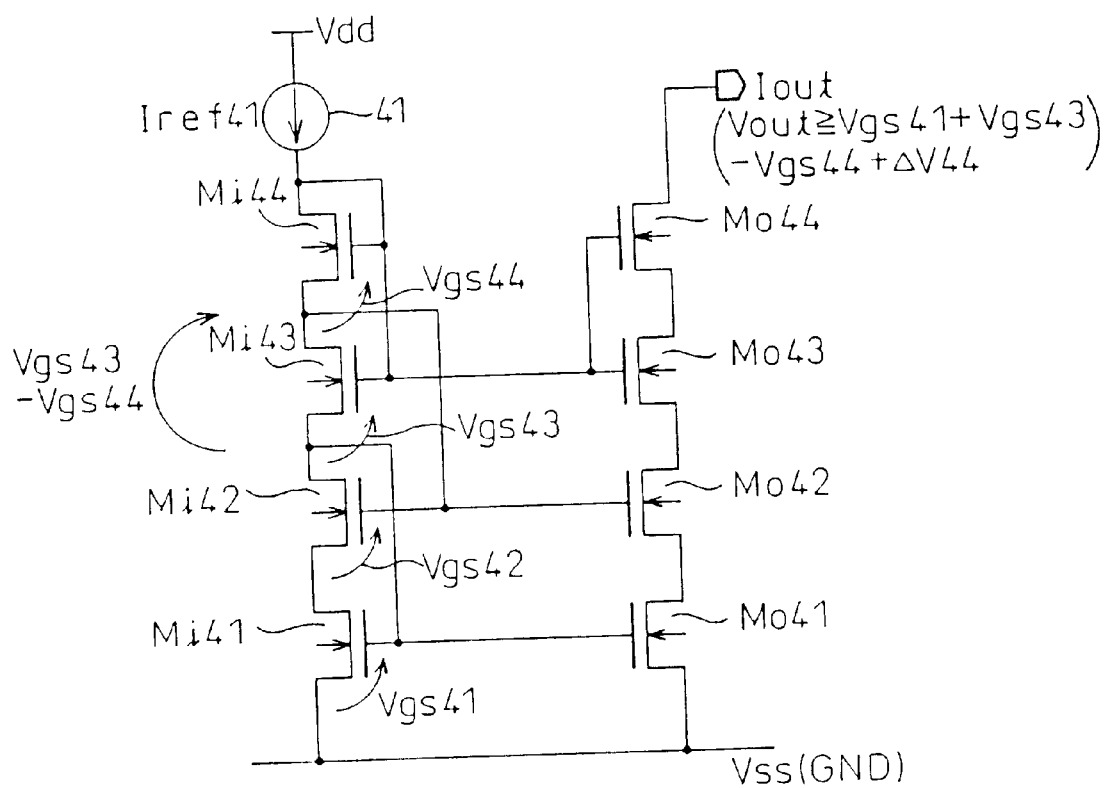
FIGS. 12A and 12B are circuit diagrams showing a fourth embodiment of the current mirror circuit according to the invention.
Figure 12B:
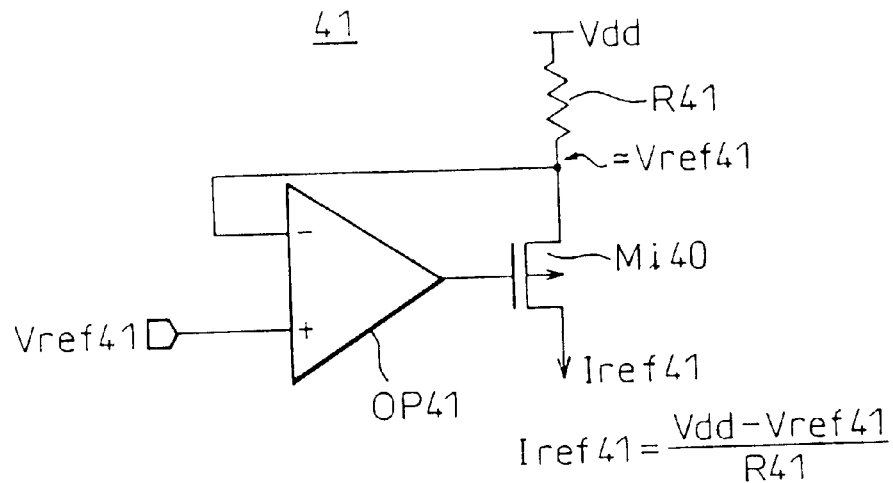

FIGS. 12A and 12B are circuit diagrams showing a current mirror circuit according to a fourth embodiment of the invention. Specifically, FIG. 12A shows an example of a quadruple cascode current mirror circuit as an application of the third embodiment described above. FIG. 12B shows an example of the reference current source 41 of the current mirror circuit of FIG. 12A. A similar reference current source can also be used as the reference current source (11, 21, 31) for each current mirror circuit including the nMOS transistor in the input circuit and the output circuit described above.

The current mirror circuit according to the fourth embodiment is adapted to operate with the gate-source voltage Vgs44 of the transistor Mi44 not higher than the threshold voltage Vth43 of the transistor Mi43. Also, the transistors Mo41, Mo42, Mo43, Mo44 are saturated when the voltage Vout applied to the output thereof is not lower than Vgs41+Vgs43−Vgs44+ΔV44, wherefrom the output current Iout remains substantially constant at N×Iref41.

As shown in FIG. 12B, the reference current source 41 includes a differential amplifier circuit; (operational amplifier) OP 41, a resistor R41 and a p-channel MOS transistor (PMOS transistor) Mi40. The source of the transistor Mi40 is connected to a high-potential power line (Vdd) through the resistor R41, and the gate of the transistor Mi40 is supplied with the output of the differential amplifier circuit OP41. Also, the positive-phase input (positive logic input) of the differential amplifier circuit OP41 is supplied with the reference voltage Vref41, while the negative-phase input of the differential amplifier circuit OP41 (negative logic input) is connected to the source of the transistor Mi40. The reference current Iref41 is supplied from the drain of the transistor Mi40 to each input transistor (Mi41, Mi42, Mi43, Mi44). The reference current Iref41 is given as (Vdd−Vref41)/R41. The reference voltage Vref41 independent of the source voltage or the production process can be secured by use of the RGR or a zener diode, for example.

Figure 13:
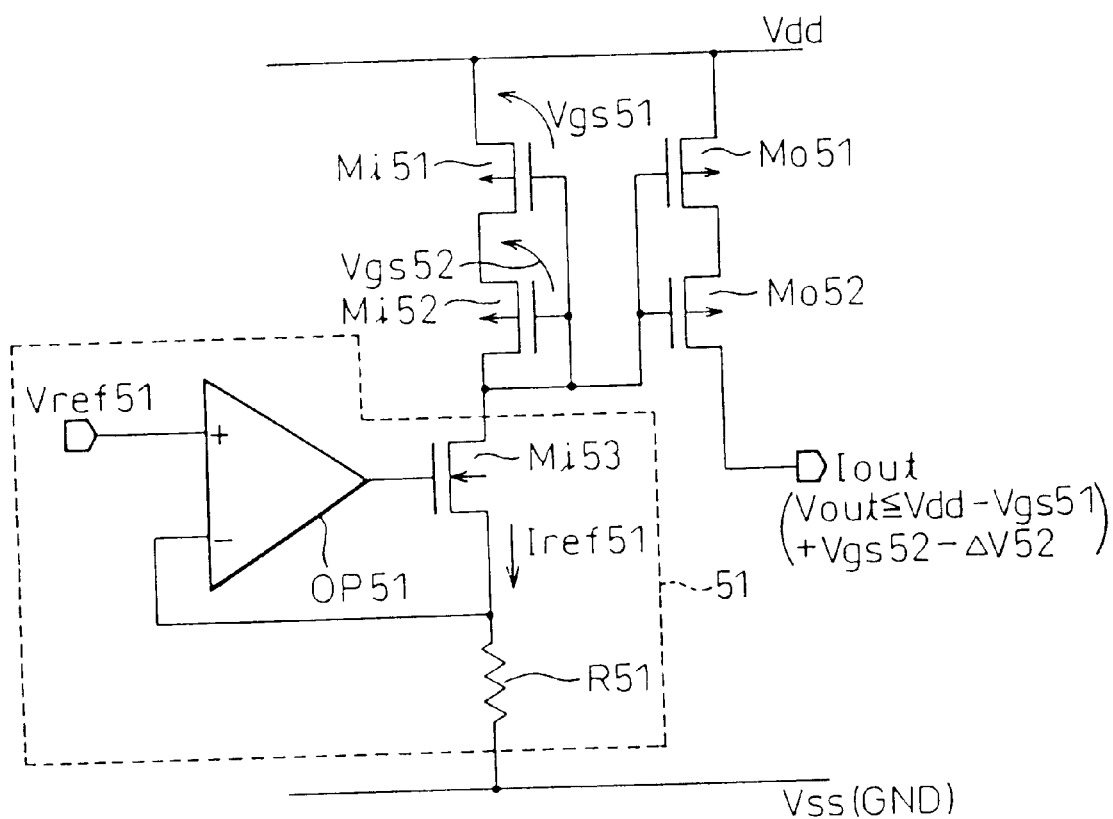
FIG. 13 is a circuit diagram showing a fifth embodiment of the current mirror circuit according to the invention.

FIG. 13 is a circuit diagram showing a current mirror circuit according to a fifth embodiment of the invention in which a pMOS transistor is used for the input circuit and the output circuit. This circuit corresponds to the current mirror circuit of the first embodiment shown in FIG. 6. In FIG. 13, a reference current source 51 is configured of a differential amplifier circuit OP51, a resistor R51 and an RMOS transistor Mi53. In this current mirror circuit using the pMOS transistor for the input and output circuits, the reference current source 51 corresponds to the reference current source 41 of the current mirror circuit using the nMOS transistor for the input and output circuits in FIG. 12B described above.

Specifically, in the reference current source 51, a transistor Mi53 has the source thereof connected through the resistor R51 to a low-potential power line Vss (GND) and has the gate thereof supplied with the output of the differential amplifier circuit OP51. The positive-phase input of the differential amplifier circuit OP51 is supplied with a reference voltage Vref51, and the negative-phase input of the differential amplifier circuit OP51 is connected to the source of the transistor Mi53. The reference current Iref51 is supplied from the drain of the transistor Mi53 to each input transistor (Mi51, Mi52). The reference current Iref51 is given as (Vref51×Vss)/R51. In the case where the BRG or a zener diode is used as the reference voltage Vref51, for example, the reference current Iref51 can be produced independently of the source voltage or the production process, as described above.

As shown in FIG. 13, the current mirror circuit according to the fifth embodiment comprises the reference current source 51 for supplying the reference current Iref51, an input circuit having two pMOS transistors Mi51, Mi52 connected in series with the reference current source 51 and an output circuit having two pMOS transistors Mo51, Mo52 connected in series with each other. The sources of the transistors Mi51, Mo51 and the gates of the transistors Mi51, Mi52 and Mo51, Mo52 are connected to each other, respectively. The drain of the transistor Mi52 is connected to the gates of the transistors MiS1, Mi52 (Mo51, Mo52) and the reference current source 51.

As a result, the reference current Iref51 flows in the transistors Mi51 and Mi52. The drain of the transistor Mo52 provides a terminal from which the output current Iout is produced. The shape ratios (given as the ratio of gate width to gate length) of the transistors Mi51 and Mo51 and the shape ratios of the transistors Mi52 and Mo52 are each in such a proportional relationship that one shape ratio is larger than the other shape ratio in the same couple by a factor of N. Specifically, assuming that the gate width and the gate length of the transistor Mi51 are W51 and L51, respectively, the shape ratio Sro51 of the transistor Mo51 is given as Sro51=N×W51/L51. Also, assuming that the gate width and the gate length of the transistor Mi52 are W52 and L52, on the other hand, the shape ratio Sro52 of the transistor Mo52 is given as Sro52=N×W52/L52. Thus the required output current Iout (=N×Iref51) can be produced. The current mirror circuit according to the fifth embodiment is adapted to operate with the gate-source voltage Vgs52 of the transistor Mi52 not higher than the threshold voltage Vth51 of the transistor Mi51. That is to say, the transistor Mi52 is adapted to operate with a voltage not higher than the threshold voltage Vth51 of the transistor Mi51. Also, the transistors Mo51, Mo52 are saturated when the voltage Vout applied to the output thereof assumes a value of not higher than Vdd−Vgs51+Vgs52−ΔV52 (say, −1.0 V), from which point on the output current Iout remains substantially constant at N×Iref51.

In the above-mentioned embodiments, the reference current source 51 (41) is not limited to the configuration shown, but various configurations are applicable. Also, the technique of configuring a current mirror circuit comprising a plurality of reference current sources disclosed in U.S. Pat. Ser. No. 4,477,782 can be improved using the present invention.

Figure 14:
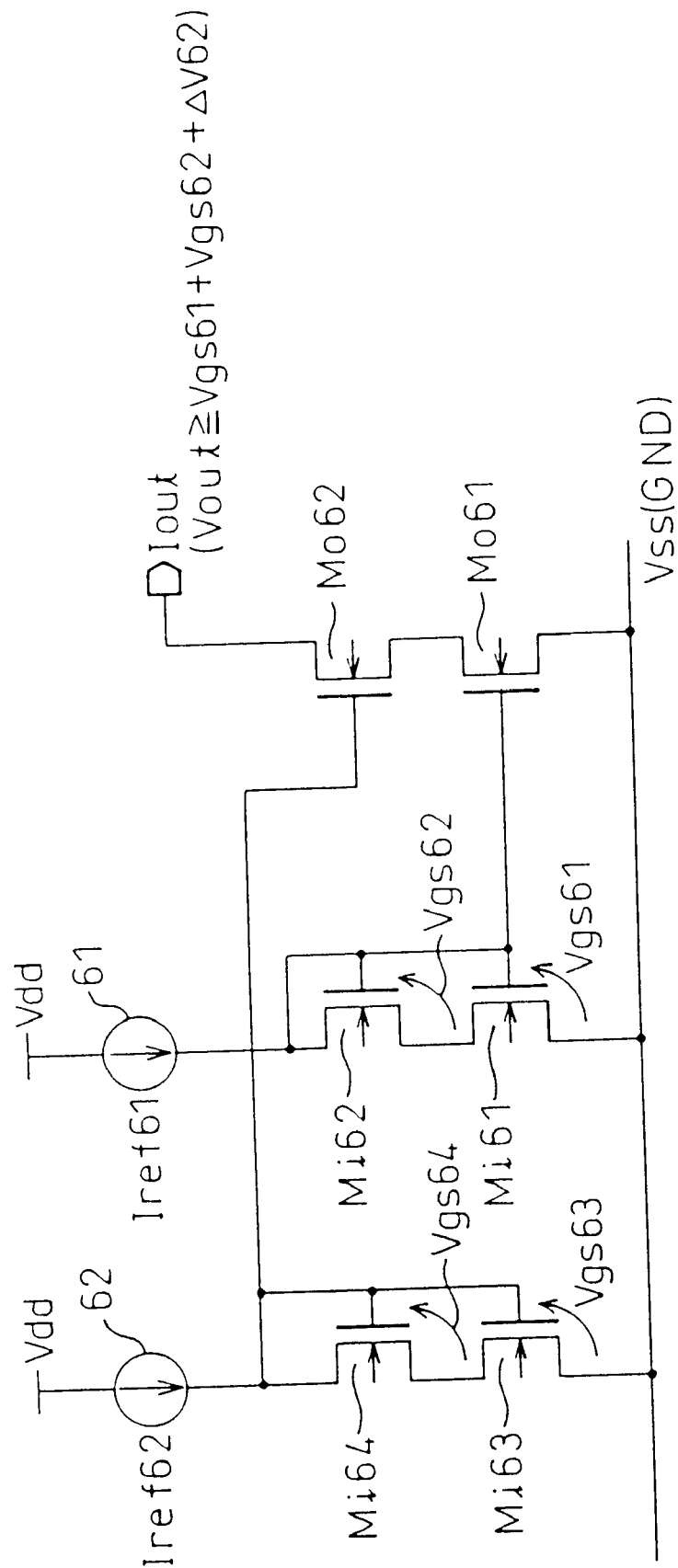
FIG. 14 is a circuit diagram showing a sixth embodiment of the current mirror circuit according to the invention.

FIG. 14 is a circuit diagram showing a current mirror circuit according to a sixth embodiment of the invention.

As shown in FIG. 14, the current mirror circuit according to the sixth embodiment comprises a reference current source 61 for supplying a reference current Iref61, a reference current source 62 for supplying a reference current Iref62, an input circuit including two nMOS transistors Mi61, Mi62 connected in series with the reference current source 61 and an output circuit including two RLMOS transistors Mo61, Mo62 connected in series with each other. The sources of the transistors Mi61, Mi63, Mo61, the gates of the transistors Mi61, Mi62, Mo61 and the gates of the transistors Mi63, Mi64, Mo62 are connected to each other, respectively. The drain of the transistor Mi62 is connected to the gates of the transistors Mi61, Mi62 (Mo61) and the reference current source 61, and the drain of the transistor Mi64 is connected to the gates of the transistors Mi63, Mi64 (Mo62) and the reference current source 62.

As a result, the reference current Iref61 flows in the transistors Mi61 and Mi62, and the reference current Iref62 flows in the transistors Mi63 and Mi64. The drain of the transistor Mo62 provides a terminal from which to produce the output current Iout. The shape ratios of the transistors Mi61 and Mo61 are in such a proportional relationship that one shape ratio is larger than the other by a factor of N. Specifically, assuming that the gate width and the gate length of the transistor Mi61 are W61 and L61, respectively, the shape ratio Sro61 of the transistor Mo6 is given as Sro61= N×W61/L61, and therefore the required output current Iout (=N×Iref61) can be produced. As for the transistor Mo62, unlike the transistor Mo61, a predetermined shape ratio is not required and it can be designed with a higher freedom. In other words, the transistor Mo61 can be configured of a small-sized transistor.

The current mirror circuit according to the sixth embodiment is adapted to operate with the gate-source voltage Vgs62 of the transistor Mi62 not higher than the threshold voltage Vth61 of the transistor Mi61, and with the gate-source voltage Vgs64 of the transistor Mi64 not higher than the threshold voltage Vth63 of the transistor Mi63. In other words, the transistor Mi62 is operated with a voltage not higher than the threshold voltage Vth63 of the transistor Mi63, and the transistor Mi64 is operated with a voltage not higher than the threshold voltage Vth63 of the transistor Mi63. The bias voltage of the gate-grounded transistor Mo62 is generated by the gate voltages of the transistors Mi63, Mi64. Specifically, the conventional current mirror circuit shown in, for example, U.S. Pat. No. 4,477,782, generates a bias voltage by a single transistor, which bias voltage deviates from an ideal value due to the channel modulation effect. According to the sixth embodiment, in contrast, the drain-source voltage Vds63 of the transistor Mi63 is set to about a saturation voltage by the transistor Mi64, and therefore the channel modulation effect is reduced. Also, the transistors Mo61, Mo62 saturate when the voltage Vout applied to the output thereof assumes a value not lower than Vgs61 +Vgs62+ΔV62, from which point on the output current Iout remains substantially constant at N×Iref61.

According to the sixth embodiment, the two reference current sources 61, 62 are required. Nevertheless, the gate-grounded transistor Mo62 can be designed in an arbitrary size.

The back gate of each transistor is connected to GND (Vss). If the back gate of each transistor is connected to the source of each transistor, in contrast, the substrate bias effect is eliminated and an operation with a lower voltage is possible. Although the present embodiment uses a N-channel transistor, the use of a P-channel transistor of course produces a similar effect.

Figure 15:
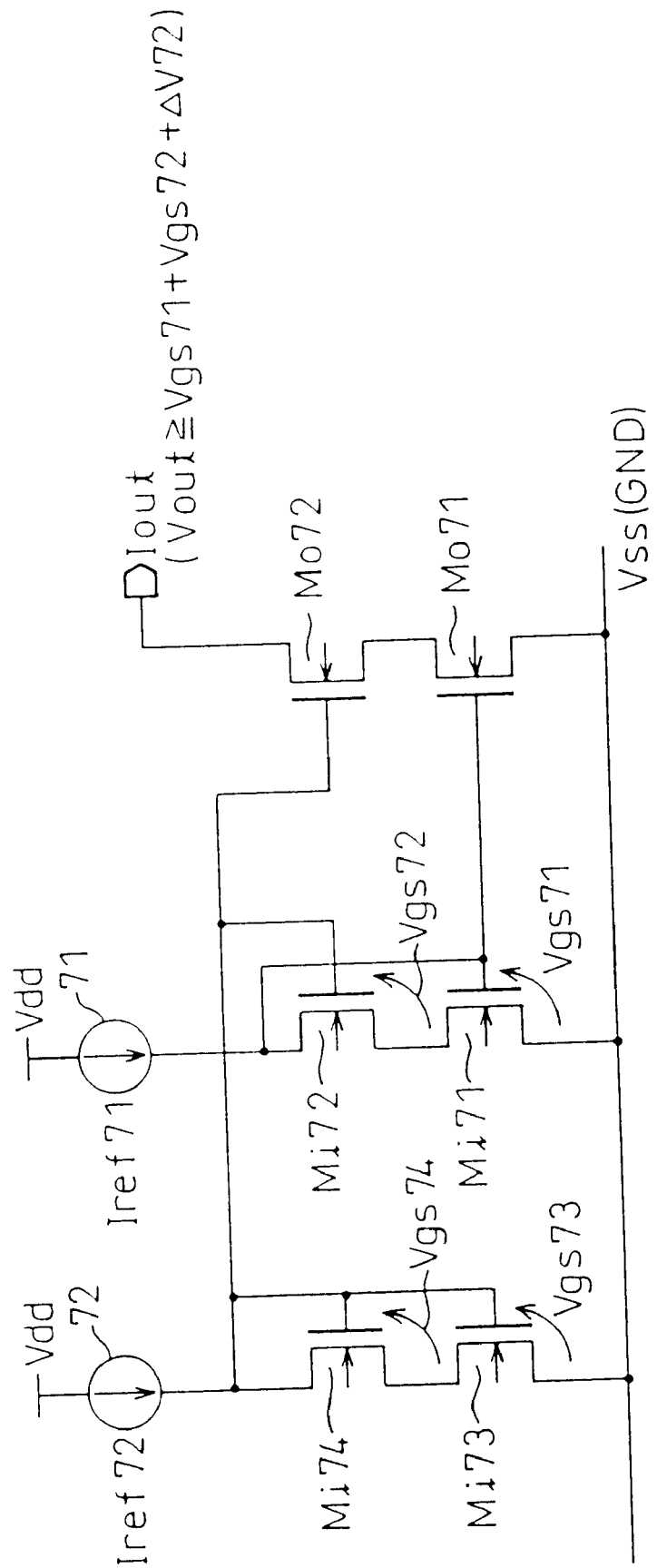
FIG. 15 is a circuit diagram showing a seventh embodiment of the current mirror circuit according to the invention.

FIG. 15 is a circuit diagram showing a current mirror circuit according to a seventh embodiment of the invention.

As shown in FIG. 15, the current mirror circuit according to the seventh embodiment comprises a reference current source 71 for supplying a reference current Iref71, a reference current source 72 for supplying a reference current Iref72, an input circuit including two nMOS transistors Mi71, Mi72 connected in series with the reference current source 71 and two nMOS transistors Mi73, Mi74 connected in series with the reference current source 72, and an output circuit including two nMOS transistors Mo71, Mo72 connected in series with each other. The sources of the transistors Mi71, Mi73, Mo71, the gates of the transistors Mi71, Mo71 and the gates of the transistors Mi72, Mi73, Mi74, Mo72 are connected to each other, respectively. Also, the drain of the transistor Mi72 is connected to the gate of the transistor Mi71 (Mo71) and the reference current source 71, while the drain of the transistor Mi74 is connected to the gates of the transistors Mi73, Mi74 (Mi72, Mo72) and the reference current source 72.

As a result, the reference current Iref71 flows in the transistors Mi71 and Mi72, and the reference current Iref72 flows in the transistors Mi73 and Mi74. The drain of the transistor Mo72 provides a terminal from which to produce the output current Iout. The shape ratios of the transistors Mi71 and Mo71 and the shape ratios of the transistors Mi72 and Mo72 are in such a proportional relationship that one shape ratio is larger than the other by a factor of N in each couple.

Specifically, assuming that the gate width and the gate length of the transistor Mi71 are W71 and L71, respectively, the shape ratio Sro71 of the transistor Mo71 is given as Sro71=N×W71/L71 and, assuming that the gate width and the gate length of the transistor Mi72 are W72 and L72, respectively, the shape ratio Sro72 of the transistor Mo72 is given as Sro72=N×W72/L72. Thus, the required output current Iout (=N×Iref71) can be produced.

Figure 16:
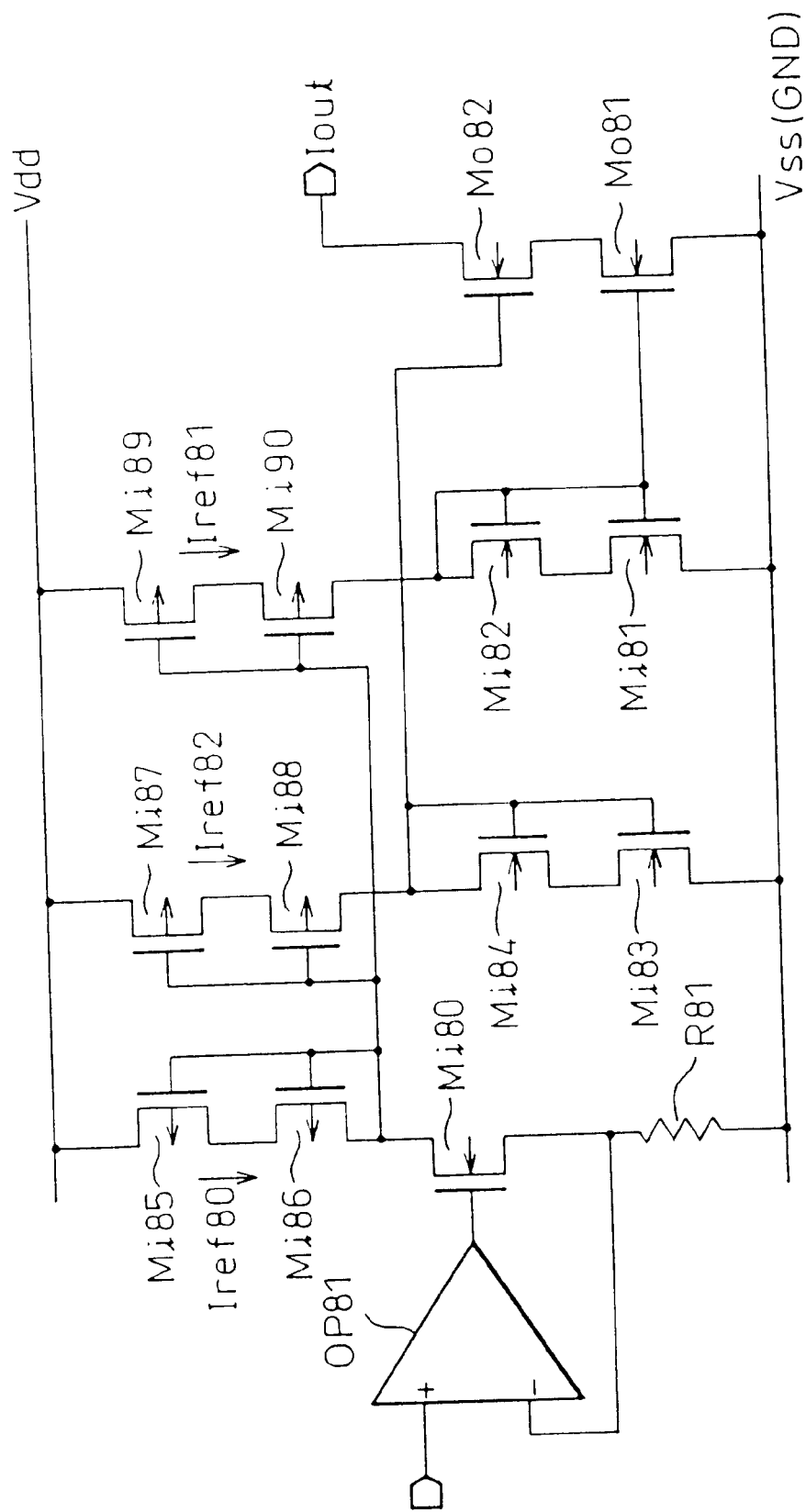
FIG. 16 is a circuit diagram showing an eighth embodiment of the current mirror circuit according to the invention.

In the seventh embodiment, though restricted in design freedom of the transistor Mo72 as compared with the sixth embodiment described above, the transistor Mi71 and the transistor Mo71 have essentially the same drain-source voltage (Vds71). According to the seventh embodiment, therefore, the mirror ratio (the output current Iout) can be set with higher accuracy than in the sixth embodiment. FIG. 16 is a circuit diagram showing a current mirror circuit according to an eighth embodiment of the invention.

As shown in FIG. 16, the current mirror circuit according to the eighth embodiment comprises an input circuit including a differential amplifier OP81, a resistor R81, nMOS transistors Mi80 to Mi84 and PMOS transistors Mi85 to Mi90 and an output circuit including nMOS transistors Mo81, Mo82. The sources of the transistors Mi81, Mi83, Mo81, the gates of the transistors Mi81, Mi82, Mo81, the gates of the transistors Mi83, Mi84, Mo82, and the gates of the transistors Mi85, Mi86, Mi87, Mi88, Mi89, Mi90 are connected to each other, respectively. Also, the drain of the transistor Mi82 is connected to the gate of the transistor Mi82 (Mi81, Mo81) and the drain of the transistor Mi90 (current source). The drain of the transistor Mi84, on the other hand, is connected to the gate of the transistor Mi84 (Mi83, Mo82) and the drain of the transistor Mi88 (power source).

The eighth embodiment corresponds to the fifth embodiment of FIG. 13 as applied to the sixth embodiment of FIG. 14. Specifically, the differential amplifier circuit OP81, the resistor 81 and the transistors Mi80, Mi85, Mi86 in the eighth embodiment correspond to the differential amplifier circuit OP51, the resistor R51, and the transistors Mi53, Mi51, Mi52, respectively, in the fifth embodiment of FIG. 13. Further, the transistors Mi87, Mi88 and Mi89, Mi90 according to the eighth embodiment correspond to the reference current sources 62, 61, respectively, in the sixth embodiment of FIG. 14. Also, the transistors Mi81, Mi82, Mi83, Mi84 and the transistors Mo81, Mo82 in the eighth embodiment correspond to the transistors Mi61, Mi62, Mi63, Mi64 and the transistors Mo61, Mo62, respectively, in the sixth embodiment of FIG. 14.

The transistors Mi87, Mi88 and Mi89, Mi90 making up the reference current sources are connected in a current-mirror fashion to the transistors Mi85, Mi86, respectively, so that the currents Iref82 and Iref81 flow in correspondence with the current Iref80 flowing in the transistors Mi85, Mi86. Specifically, according to the eighth embodiment, two reference currents Iref81, Iref82 (Mi89, Mi90; Mi87, Mi88) are generated with high accuracy from a single reference current source (OP81, R81, Mi80, Mi85, Mi86). This will not be described in detail as it is similar to the description given above with reference to FIGS. 13 and 14. Although the eighth embodiment represents a method in which a single current is generated, various other techniques can of course be used for generating a reference current(s) with equal effect.

Figure 17:
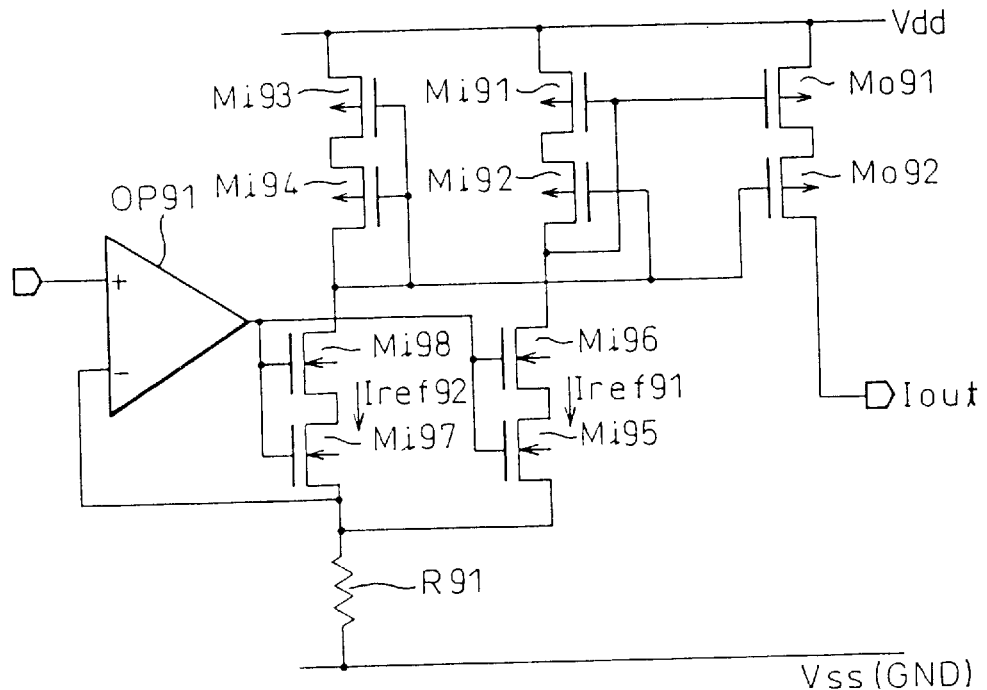
FIG. 17 is a circuit diagram showing a ninth embodiment of the current mirror circuit according to the invention.

FIG. 17 is a circuit diagram showing a current mirror circuit according to a ninth embodiment of the invention. This embodiment as a whole corresponds to the seventh embodiment shown in FIG. 15 to which the fifth embodiment of FIG. 13 is applied. In the ninth embodiment, the current mirror circuit of the seventh embodiment shown in FIG. 15 is configured of at least a pMOS transistor, and two transistors Mi97, Mi98 are connected in series with each other in place of the transistor Mi53 included in the fifth embodiment shown in FIG. 13.

Specifically, the differential amplifier circuit OP91, the resistor R91, and the transistors Mi97, Mi98 and Mi93, Mi94 in the ninth embodiment correspond to the differential amplifier circuit OP51, the resistor R51, and the transistors Mi53, Mi51, Mi52 of the fifth embodiment shown in FIG. 13, respectively. Further, the transistors Mi95, Mi96 and Mi97, Mi98 in the ninth embodiment correspond to the reference current sources 71 and 72, respectively, in the seventh embodiment shown in FIG. 15. Also, the transistors Mi91, Mi92, Mi93, Mi94 and the transistors Mo91, Mo92 in the ninth embodiment correspond to the transistors Mi71, Mi72, Mi73, Mi74 and the transistors Mo71, Mo72, respectively, in the seventh embodiment of FIG. 15. The ninth embodiment uses PMOS transistors (Mi91, Mi92, Mi93, Mi94; Mo91, Mo92) for the input circuit and the output circuit thereof, respectively, which have the opposite polarity to the nMOS transistors (Mi71, Mi72, Mi73, Mi74; Mo71, Mo7) in the seventh embodiment shown in FIG. 15. As a result, the connections to the high-potential power line Vdd and the low-potential power line Vss (GND) are also inverted. Nevertheless, the two embodiments have substantially the same configuration.

In the eighth embodiment shown in FIG. 16, the current (reference current Iref80) flowing in the transistor Mi80 (transistors Mi85, Mi86) controlled by the differential amplifier circuit OP81 is not direutly used as a reference current source for actually supplying reference currents (Iref82 and Iref82) to the transistors Mi83, Mi84 and Mi81, Mi82 of the input circuit. Instead, the reference current Iref82 is produced from the transistors Mi87, Mi88 connected in a current mirror fashion to the transistors Mi85, Mi86, and the reference current Iref81 is produced from the transistors Mi89, Mi90. Also, in the ninth embodiment shown in FIG. 17, as the reference current sources for actually supplying reference currents (Iref92 and Iref91) to the transistors Mi93, Mi94 and Mi91, Mi92 of the input circuit, the reference current Iref92 is derived directly from the current flowing in the transistors Mi97, Mi98 controlled by the differential amplifier circuit OP91, while the reference current Iref91 is produced from the transistors Mi95, Mi96 connected in a current mirror fashion with the transistors Mi97, Mi98. This is in order to prevent the accuracy deterioration which would be caused by the distribution of the output of a single transistor (current source) Mi80 into a plurality of outputs as in the eighth embodiment of FIG. 16 due to the low output impedance of the single transistor.

Figure 18:
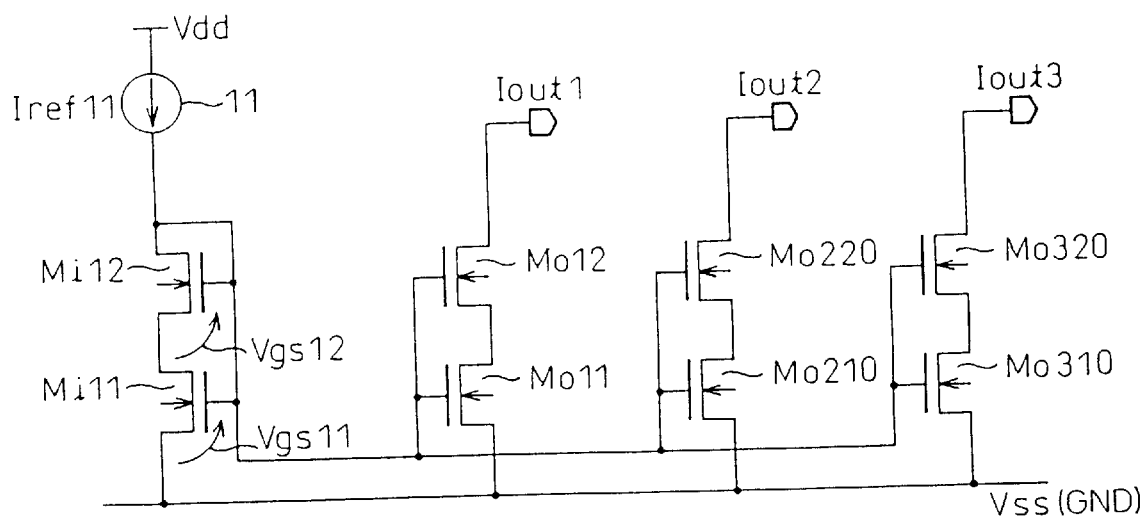
FIG. 18 is a circuit diagram showing a tenth embodiment of the current mirror circuit according to the invention.

FIG. 18 is a circuit diagram showing a current mirror circuit according to a tenth embodiment of the invention. This embodiment corresponds to the first embodiment of FIG. 6 having three output circuits. Specifically, the reference current source 11, the input circuit (transistors Mi11, Mi12) and an output circuit (first output circuit including transistors Mo11, Mo12) are similar to the corresponding parts of the current mirror circuit shown in FIG. 6. The tenth embodiment, however, further comprises a second output circuit including transistors Mo210, Mo220 and a third output circuit including transistors Mo310, Mo320 added to the circuit of FIG. 6.

The shape ratios of the transistors Mi11 and Mo11 and the shape ratios of the transistors Mi12 and Mo12 are in such a proportional relation that one shape ratio in each transistor couple is larger than the other in the same couple by a factor of NA. Similarly, the shape ratios of the transistors Mi11 and Mo310 and the shape ratios of the transistors Mi12 and Mo220 are in such a proportional relation that one shape ratio in each transistor couple is larger than the other in the same couple by a factor of NB. Further, the shape ratios of the transistors Mi11 and Mo310 and the shape ratios of the transistors Mi12 and Mo320 are in such a proportional relation that one shape ratio in each transistor couple is larger than the other in the same couple by a factor of NC.

Specifically, assuming that the gate width and the gate length of the transistor Mi11 are W11 and L11, respectively, the shape ratio Sro11 of the transistor Mo11 is given as Sro11=NA×W11/L11. Also, assuming that the gate width and the gate length of the transistor Mi12 are W12 and L12, respectively, the shape ratio Sro12 of the transistor Mo12 is given as Sro12=NA×W12/L12. Further, the shape ratio Sro210 of the transistor Mo210 is given as Sro210=NB×W11/L11, and the shape ratio Sro220 of the transistor Mo220 as Sro220=NB×W12/L12. The shape ratio Sro310 of the transistor Mo310 is given as Sro310=NC×W11/L11, and the shape ratio Sro320 of the transistor Mo320 as Sro320=NC×W12/L12. As a result, the required output currents Iout1 (=NA×Iref11), Iout2 (=NB×Iref11) and Iout3 (=NC×Iref11) can be produced from each circuit.

The number of the output circuits is not limited to three, but more than three output circuits can be provided as required. The tenth embodiment is applicable to each of the above-mentioned embodiments.

The current mirror circuit according to each embodiment of the invention described above is applicable to various semiconductor integrated circuits. Also, apart from the applications of PMOS and nMOS transistors to the current mirror circuit of each embodiment described above, the current mirror circuit according to the invention can be used with various field effect transistors (FET) as well as with the MOS transistors.

It will thus be understood from the foregoing detailed description that according to the invention, there is provided a current mirror circuit which has a high output impedance and at the same time a mirror ratio can be set with high accuracy even when the source voltage is low.

Many different embodiments of the present invention may be constructed without departing from the spirit and scope of the present invention, it should be understood that the present invention is not limited to the specific embodiments described in this specification, except as defined in the appended claims.

What is claimed is:

1. A current mirror circuit, having a plurality of field effect transistors, comprising a reference current source for supplying a reference current, an input circuit connected to said reference current source and supplied with said reference current, and at least one output circuit connected to said input circuit in a current mirror fashion, wherein:

said input circuit includes first and second input transistors connected in series with each other, gates of said first and second input transistors are both connected to a drain of said second input transistor, and the drain of said second input transistor is connected to said reference current source;

said output circuit includes first and second output transistors connected in series with each other, a source of said first output transistor is connected to a source of said first input transistor, gates of said first and second output transistors are connected to the gates of said first and second input transistors, respectively, and an output current is produced from a drain of said second output transistor; and said second input transistor is operated with a voltage not higher than a threshold voltage of said first input transistor.

2. A current mirror circuit as claimed in claim 1, wherein shape ratios of a transistor in said input circuit and a corresponding transistor in each of said output circuits are in a fixed relation with each other.

3. A current mirror circuit as claimed in claim 2, wherein the shape ratio of each of said transistors is arbitrarily set for each of said output circuits.

4. A current mirror circuit as claimed in claim 1, wherein said current mirror circuit is used as a power circuit for a semiconductor integrated circuit.

5. A current mirror circuit as claimed in claim 1, wherein:

said reference current source includes a differential amplifier circuit, a current source circuit for receiving an output of said differential amplifier circuit, and a resistor connected in series with said current source circuit; and a reference voltage is applied to a positive phase input of said differential amplifier circuit, a voltage at a junction node of said resistor and said current source circuit is applied to a negative phase input of said differential amplifier circuit.

6. A current mirror circuit as claimed in claim 5, wherein:

said current source circuit includes a current source transistor circuit having at least one field effect transistor; and said current source transistor circuit includes a first current source transistor, a source of said first current source transistor constitutes a reference terminal, a gate of said first current source transistor constitutes a current control terminal, and a drain of said first current source transistor constitutes an output terminal.

7. A current mirror circuit as claimed in claim 5, wherein:

said current source circuit includes a current source transistor circuit having at least one field effect-transistor; and said current source transistor circuit includes first and second current source transistors connected in series with each other, a source of said first current source transistor constitutes a reference terminal, gates of said first and second current source transistors constitute a current control terminal, a drain of said second current source transistor constitutes an output terminal, and said second current source transistor is operated with a voltage not higher than a threshold voltage of said first current source transistor.

8. A current mirror circuit as claimed in claim 7, wherein said second current source transistor has a threshold voltage lower than a threshold voltage of said first current source transistor, the gates of which are connected to each other.

9. A current mirror circuit as claimed in claim 7, wherein said second current source transistor has substantially the same threshold voltage as said first current source transistor, the gates of which are connected to each other, said second current source transistor being operated in a weak inversion region not higher than the threshold voltage thereof.

10. A current mirror circuit as claimed in claim 1, wherein said second input transistor has a threshold voltage lower than a threshold voltage of said first input transistor, the gates of which are connected to each other.

11. A current mirror circuit as claimed in claim 1, wherein said second input transistor has substantially the same threshold voltage as said first input transistor, the gates of which are connected to each other, said second input transistor being operated in a weak inversion region not higher than the threshold voltage thereof.

12. A current mirror circuit, having a plurality of field effect transistors, comprising a reference current source for supplying a reference current, an input circuit connected to said reference current source and supplied with said reference current, and at least one output circuit connected to said input circuit in a current mirror fashion, wherein:

said input circuit includes first, second and third input transistors connected in series with each other, a gate of said first input transistor is connected to a drain of said first input transistor, gates of said second and third input transistors are both connected to a drain of said third input transistor, and the drain of said third input transistor is connected to said reference current source;

said output circuit includes first, second and third output transistors connected in series with each other, a source of said first output transistor is connected to a source of said first input transistor, a gate of said first output transistor is connected to the gate of said first input transistor, gates of said second and third output transistors are connected to the gates of said second and third input transistors, respectively, and an output current is produced from a drain of said third output transistor; and said third input transistor is operated with a voltage not higher than a threshold voltage of said second input transistor.

13. A current mirror circuit as claimed in claim 12, wherein shape ratios of a transistor in said input circuit and a corresponding transistor in each of said output circuits are in a fixed relation with each other.

14. A current mirror circuit as claimed in claim 13, wherein the shape ratio of each of said transistors is arbitrarily set for each of said output circuits.

15. A current mirror circuit as claimed in claim 12, wherein said current mirror circuit is used as a power circuit for a semiconductor integrated circuit.

16. A current mirror circuit as claimed in claim 12, wherein:

said reference current source includes a differential amplifier circuit, a current source circuit for receiving an output of said differential amplifier circuit, and a resistor connected in series with said current source circuit; and a reference voltage is applied to a positive phase input of said differential amplifier circuit, a voltage at a junction node of said resistor and said current source circuit is applied to a negative phase input of said differential amplifier circuit.

17. A current mirror circuit as claimed in claim 16, wherein:

said current source circuit includes a current source transistor circuit having at least one field effect transistor; and said current source transistor circuit includes a first current source transistor, a source of said first current source transistor constitutes a reference terminal, a gate of said first current source transistor constitutes a current control terminal, and a drain of said first current source transistor constitutes an output terminal.

18. A current mirror circuit as claimed in claim 16, wherein:

said current source circuit includes a current source transistor circuit having at least one field effect transistor; and said current source transistor circuit includes first and second current source transistors connected in series with each other, a source of said first current source transistor constitutes a reference terminal, gates of said first and second current source transistors constitutes a current control terminal, a drain of said second current source transistor constitutes an output terminal, and said second current source transistor is operated with a voltage not higher than a threshold voltage of said first current source transistor.

19. A current mirror circuit as claimed in claim 18, wherein said second current source transistor has a threshold voltage lower than a threshold voltage of said first current source transistor, the gates of which are connected to each other.

20. A current mirror circuit as claimed in claim 18, wherein said second current source transistor has substantially the same threshold voltage as said first current source transistor, the gates of which are connected to each other, said second current source transistor being operated in a weak inversion region not higher than the threshold voltage thereof.

21. A current mirror circuit as claimed in claim 12, wherein said third input transistor has a threshold voltage lower than a threshold voltage of said second input transistor, the gates of which are connected to each other.

22. A current mirror circuit as claimed in claim 12, wherein said third input transistor has substantially the same threshold voltage as said second input transistor, the gates of which are connected to each other, said third input transistor being operated in a weak inversion region not higher than the threshold voltage thereof.

23. A current mirror circuit, having a plurality of field effect transistors, comprising a reference current source for supplying a reference current, an input circuit connected to said reference current source and supplied with said reference current, and at least one output circuit connected to said input circuit in a current mirror fashion, wherein:

said input circuit includes first, second and third input transistors connected in series with each other, a gate of said first input transistor is connected to a drain of said second input transistor, gates of said second and third input transistors are both connected to a drain of said third input transistor, and the drain of said third input transistor is connected to said reference current sources;

said output circuit includes first, second and third output transistors connected in series with each other, a source of said first output transistor is connected to the source of said first input transistor, a gate of said first output transistor is connected to the gate of said first input transistor, gates of said second and third output transistors are connected to the gates of said second and third input transistors, respectively, and an output current is produced from a drain of said third output transistor; and said third input transistor is operated with a voltage not higher than a threshold voltage of said second input transistor.

24. A current mirror circuit as claimed in claim 23, wherein shape ratios of a transistor in said input circuit and a corresponding transistor in each of said output circuits are in a fixed relation with each other.

25. A current mirror circuit as claimed in claim 24, wherein the shape ratio of each of said transistors is arbitrarily set for each of said output circuits.

26. A current mirror circuit as claimed in claim 23, wherein said current mirror circuit is used as a power circuit for a semiconductor integrated circuit.

27. A current mirror circuit as claimed in claim 23, wherein:

said reference current source includes a differential amplifier circuit, a current source circuit for receiving an output of said differential amplifier circuit, and a resistor connected in series with said current source circuit; and a reference voltage is applied to a positive phase input of said differential amplifier circuit, a voltage at a junction node of said resistor and said current source circuit is applied to a negative phase input of said differential amplifier circuit.

28. A current mirror circuit as claimed in claim 27, wherein:

said current source circuit includes a current source transistor circuit having at least one field effect transistor; and said current source transistor circuit includes a first current source transistor, a source of said first current source transistor constitutes a reference terminal, a gate of said first current source transistor constitutes a current control terminal, and a drain of said first current source transistor constitutes an output terminal.

29. A current mirror circuit as claimed in claim 27, wherein:

said current source circuit includes a current source transistor circuit having at least one field effect transistor; and said current source transistor circuit includes first and second current source transistors connected in series with each other, a source of said first current source transistor constitutes a reference terminal, gates of said first and second current source transistors constitute a current control terminal, a drain of said second current source transistor constitutes an output terminal, and said second current source transistor is operated with a voltage not higher than a threshold voltage of said first current source transistor.

30. A current mirror circuit as claimed in claim 29, wherein said second current source transistor has a threshold voltage lower than a threshold voltage of said first current source transistor, the gates of which are connected to each other.

31. A current mirror circuit as claimed in claim 29, wherein said second current source transistor has substantially the same threshold voltage as said first current source transistor, the gates of which are connected to each other, said second current source transistor being operated in a weak inversion region not higher than the threshold voltage thereof.

32. A current mirror circuit as claimed in claim 23, wherein said third input transistor has a threshold voltage lower than a threshold voltage of said second input transistor, the gates of which are connected to each other.

33. A current mirror circuit as claimed in claim 23, wherein said third input transistor has substantially the same threshold voltage as said second input transistor, the gates of which are connected to each other, said third input transistor being operated in a weak inversion region not higher than the threshold voltage thereof.

34. A current mirror circuit, having a plurality of field effect transistors, comprising a reference current source for supplying a reference current, an input circuit connected to said reference current source and supplied with said reference current, and at least one output circuit connected to said input circuit in a current mirror fashion, wherein:

said input circuit includes first to Xth input transistors connected in series with each other, gates of Kth from said first to (X−2)th arbitrary input transistors are connected to a drain of (K+1)th input transistor, gates of said Xth and (X−1)th input transistors are both connected to a drain of said Xth input transistor, and the drain of said Xth input transistor is connected to said reference current source;

said output circuit includes first to Xth output transistors connected in series with each other, a source of said first output transistor is connected to a source of said first input transistor, gates of Kth to (X−2)th arbitrary output transistors are connected to the gate of said Kth input transistor, gates of said Xth and (X−1)th output transistors are connected to the gates of said Xth and (X−1)th input transistors, respectively, and an output current is produced from a drain of said Xth output transistor; and said Xth input transistor is operated with a voltage not higher than a threshold voltage of said (X−1)th input transistor.

35. A current mirror circuit as claimed in claim 34, wherein shape ratios of a transistor in said input circuit and a corresponding transistor in each of said output circuits are in a fixed relation with each other.

36. A current mirror circuit as claimed in claim 35, wherein the shape ratio of each of said transistors is arbitrarily set for each of said output circuits.

37. A current mirror circuit as claimed in claim 34, wherein said current mirror circuit is used as a power circuit for a semiconductor integrated circuit.

38. A current mirror circuit as-claimed in claim 34, wherein:

said reference current source includes a differential amplifier circuit, a current source circuit for receiving an output of said differential amplifier circuit, and a resistor connected in series with said current source circuit; and a reference voltage is applied to a positive phase input of said differential amplifier circuit, a voltage at a junction node of said resistor and said current source circuit is applied to a negative phase input of said differential amplifier circuit.

39. A current mirror circuit as claimed in claim 38, wherein:

said current source circuit includes a current source transistor circuit having at least one field effect transistor; and said current source transistor circuit includes a first current source transistor, a source of said first current source transistor constitutes a reference terminal, a gate of said first current source transistor constitutes a current control terminal, and a drain of said first current source transistor cbnstitutesan output terminal.

40. A current mirror circuit as claimed in claim 38, wherein:

said current source circuit includes a current source transistor circuit having at least one field effect transistor; and said current source transistor circuit includes first and second current source transistors connected in series with each other, a source of said first current source transistor constitutes a reference terminal, gates of said first and second current source transistors constitute a current control terminal, a drain of said second current source transistor constitutes an output terminal, and said second current source transistor is operated with a voltage not higher than a threshold voltage of said first current source transistor.

41. A current mirror circuit as claimed in claim 40, wherein said second current source transistor has a threshold voltage lower that a threshold voltage of said first current source transistor, the gates of which are connected to each other.

42. A current mirror ircuit as claimed in claim 40, wherein said second current source transistor has substantially the same threshold voltage as said first current source transistor, the gates of which are connected to each other, said second current source transistor being operated in a weak inversion region not higher than the threshold voltage thereof.

43. A current mirror circuit as claimed in claim 34, wherein said Xth input transistor has a threshold voltage lower than a threshold voltage of said (X−1)th input transistor, the gates of which are connected to each other.

44. A current mirror c ircuit as claimed in claim 34, wherein said Xth input transistor has substantially the same threshold voltage as said (X−1)th input transistor, the gates of which are connected to each other, said Xth input transistor being operated in a weak inversion region not higher than the threshold voltage thereof.

45. A current mirror circuit, having a plurality of field effect transistors, comprising a first-reference current source for supplying a first reference current, a second reference current source for supplying a second reference current, an input circuit connected to said first and second reference current sources and supplied with said first and second reference currents, and at least one output circuit connected to said input circuit in a current mirror fashion wherein:

said input circuit includes first and second input transistors connected in series with each other and third and fourth input transistors connected in series with each other, gates of said first and second input transistors are both connected to a drain of said second input transistor, the drain of said second input transistor is connected to eaid first reference current source, gates of said third and fourth input transistors are both connected to a drain of said fourth input transistor, and the drain of said fourth input transistor is connected to said second reference current source;

said output circuit includes first and second output transistors connected in series with each other, a source of said first output transistor is connected to the sources of said first and third input transistors, a gate of said first output transistor is connected to the gates of said first and second input transistors, a gate of said second output transistor is connected to the gates of said third and fourth input transistors, and an output current is produced from a drain of said second output transistor; and said second input transistor is operated with a voltage not higher than a threshold voltage of said first input transistor, and said fourth input transistor is operated with a voltage not higher than a threshold voltage of said third input transistor.

46. A current mirror circuit as claimed in claim 45, wherein shape ratios of a transistor in said input circuit and a corresponding transistor in each of said output circuits are in a fixed relation with each other.

47. A current mirror circuit as claimed in claim 46, wherein the shape ratio of each of said transistors is arbitrarily set for each of said outpat circuits.

48. A current mirror circuit as claiuted in claim 45, wherein said current mirror circuit is used as a power circuit for a semiconductor integrated circuit.

49. A current mirror circuit as claimed in claim 45, wherein:

each of said first and second reference current sources includes a differential amplifier circuit, a current source circuit for receiving an output of said differential amplifier circuit, and a resistor connected in series with said current source circuit; and a reference voltage is applied to a positive phase input of said differential amplifier circuit, a voltage at a junction node of said resistor and said current source circuit is applied to a negative phase input of said differential amplifier circuit.

50. A current mirror circuit as claimed in claim 49, wherein:

said current source circuit includes a current source transistor circuit having at least one field effect transistor; and said current source transistor circuit includes a first current source transistor, a source of said first current source transistor constitutes a reference terminal, a gate of said first current source transistor constitutes a current control terminal, and a drain of said first current source transistor constitutes an output terminal.

51. A current mirror circuit as claimed in claim 50, wherein:

said current source circuit includes a current source transistor circuit having at least one field effect transistor; and said current source transistor circuit includes first and second current source transistors connected in series with each other, a source of said first current source transistor constitutes a reference terminal, gates of said first and second current source transistors constitute a current control terminal, a drain of said second current source transistor constitutes an output terminal, and said second current source transistor is operated with a voltage not higher than a threshold voltage of said first current source transistor.

52. A current mirror circuit as claimed in claim 51, wherein said second current source transistor has a threshold voltage lower than a threshold voltage of said first current source transistor, the gates of which 1are connected to each other.

53. A current mirror circuit as claimed in claim 52, wherein said second current source transistor has substantially the same threshold voltage as said first current source transistor, the gates of which are connected to each other, said second current source transistor being operated in a weak inversion region not higher than the threshold voltage thereof.

54. A current mirror circuit as claimed in claim 45, wherein said second input transistor has a threshold voltage lower than a threshold voltage of said first input transistor, and the gates of said first and second input transistors are connected to each other.

55. A current mirror circuit as claimed in claim 45, wherein said fourth input transistor has a threshold voltage lower than a threshold voltage of said third input transistor, and the gates of said third and fourth input transistors are connected to each other.

56. A current mirror circuit as claimed in claim 45, wherein said second input transistor has substantially the same threshold voltage as said first input transistor, and the gates of said first and second input transistors are connected to each other, said second input transistor being operated in a weak inversion region not higher than the threshold voltage thereof.

57. A current mirror circuit as claimed in claim 45, wherein said fourth input transistor has substantially the same threshold voltage as said third input transistor, and the gates of said third and fourth input transistors are connected to each other, said fourth input transistor being operated in a weak inversion region not higher than the threshold voltage thereof.

58. A current mirror circuit, having a plurality of field effect transistors, comprising a first reference current source for supplying a first reference current, a second reference current source for supplying a second reference current, an input circuit connected to said first and second reference current sources and supplied with said first and second reference currents, and at least one output circuit connected to said input circuit in a current mirror fashion, wherein:

said input circuit includes first and second input transistors connected in series with each other and third and fourth input transistors connected in series with each other, a gate of the first input transistor is connected to a drain of said second input transistor, the drain of said second input transistor is connected to said first reference current source, gates of said second, third and fourth input transistors are connected to a drain of said fourth input transistor, and the drain of said fourth input transistor is connected to said second reference current source;

said output circuit includes first and second output transistors connected in series with each other, a source of said first output transistor is connected to the sources of said first and third input transistors, a gate of said first output transistor is connected to the gate of said first input transistor, a gate of said second output transistor is connected to the gates of said second, third and fourth input transistors, and an output current is produced from a drain of said second output transistor; and said fourth input transistor is operated with a voltage not higher than a threshold voltage of said third input transistor.

59. A current mirror circuit as claimed in claim 58, wherein shape ratios of a transistor in said input circuit and a corresponding transistor in each of said output circuits are in a fixed relation with each other.

60. A current mirror circuit as claimed in claim 59, wherein the shape ratio of each of said transistors is arbitrarily set for each of said output circuits.

61. A current mirror circuit as claimed in claim 58, wherein said current mirror circuit is used as a power circuit for a semiconductor integrated circuit.

62. A current mirror circuit as claimed in claim 58, wherein:
   each of said first and second reference current sources includes a differential amplifier circuit, a current source circuit for receiving an output of said differential amplifier circuit, and a resistor connected in series with said current source circuit; and
   a reference voltage is applied to a positive phase input of said differential amplifier circuit, a voltage at a junction node of said resistor and said current source circuit is applied to a negative phase input of said differential amplifier circuit.

63. A current mirror circuit as claimed in claim 62, wherein:
   said current source circuit includes a current source transistor circuit having at least one field effect transistor; and
   said current source transistor circuit includes a first current source transistor, a source of said first current source transistor constitutes a reference terminal, a gate of said first current source transistor constitutes a current control terminal, and a drain of said first current source transistor constitutes an output terminal.

64. A current mirror circuit as claimed in claim 63, wherein:
   said current source circuit includes a current source transistor circuit having at least one field effect transistor; and
   said current source transistor circuit includes first and second current source transistors connected in series with each other, a source of said first current source transistor constitutes a reference terminal, gates of said first and second current source transistors constitute a current control terminal, a drain of said second current source transistor constitutes an output terminal, and said second current source transistor is operated with a voltage not higher than a threshold voltage of said first current source transistor.

65. A current mirror circuit as claimed in claim 64, wherein said second current source transistor has a threshold voltage lower than a threshold voltage of said first current source transistor, the gates of which are connected to each other.

66. A current mirror circuit as claimed in claim 64, wherein said second current source transistor has substantially the same threshold voltage as said first current source transistor, the gates of which are connected to each other, said second current source transistor being operated in a weak inversion region not higher than the threshold voltage thereof.

67. A current mirror circuit as claimed in claim 58, wherein said fourth input transistor has a threshold voltage lower than a threshold voltage of said third input transistor, and the gates of said third and fourth input transistors are connected to each other.

68. A current mirror circuit as claimed in claim 58, wherein said fourth input transistor has substantially the same threshold voltage as said third input transistor, and the gates of said third and fourth input transistors are connected to each other, said fourth input transistor being operated in a weak inversion region not higher than the threshold voltage thereof.

69. A semiconductor integrated circuit having a power circuit constituted by a current mirror circuit having a plurality of field effect transistors, said current mirror circuit comprising a reference current source for supplying a reference current, an input circuit connected to said reference current source and supplied with said reference current, and at least one output circuit connected to said input circuit in a current mirror fashion, wherein:
   said input circuit includes first and second input transistors connected in series with each other, gates of said first and second input transistors are both connected to a drain of said second input transistor, and the drain of said second input transistor is connected to said reference current source;
   said output circuit includes first and second output transistors connected in series with each other, a source of said first output transistor is connected to a source of said first input transistor, gates of said first and second output transistors are connected to the gates of said first and second input transistors, respectively, and an output current is produced from a drain of said second output transistor; and
   said second input transistor is operated with a voltage not higher than a threshold voltage of said first input transistor.

70. A semiconductor integrated circuit having a power circuit constituted by a current mirror circuit having a plurality of field effect transistors, said current mirror circuit comprising a reference current source for supplying a reference current, an input circuit connected to said reference current source and supplied with said reference current, and at least one output circuit connected to said input circuit in a current mirror fashion, wherein:
   said input circuit includes first, second and third input transistors connected in series with each other, a gate of said first input transistor is connected to a drain of said first input transistor, gates of said second and third input transistors are both connected to a drain of said third input transistor, and the drain of said third input transistor is connected to said reference current source;
   said output circuit includes first, second and third output transistors connected in series with each other, a source of said first output transistor is connected to a source of said first input transistor, a gate of said first output transistor is connected to the gate of said first input transistor, gates of said second and third output transistors are connected to the gates of said second and third input transistors, respectively, and an output current is produced from a drain of said third output transistor; and
   said third input transistor is operated with a voltage not higher than a threshold voltage of said second input transistor.

71. A semiconductor integrated circuit having a power circuit constituted by a current mirror circuit having a plurality of field effect transistors, said current mirror circuit comprising a reference current source for supplying a reference current, an input circuit connected to said reference current source and supplied with said reference current, and at least one output circuit connected to said input circuit in a current mirror fashion, wherein:

said input circuit includes first, second and third input transistors connected in series with each other, a gate of said first input transistor is connected to a drain of said second input transistor, gates of said second and third input transistors are both connected to a drain of said third input transistor, and the drain of said third input transistor is connected to said reference current source;

said output circuit includes first, second and third output transistors connected in series with each other, a source of said first output transistor is connected to the source of said first input transistor, a gate of said first output transistor is connected to the gate of said first input transistor, gates of said second and third output transistors are connected to the gates of said second and third input transistors, respectively, and an output current is produced from a drain of said third output transistor; and said third input transistor is operated with a voltage not higher than a threshold voltage of said second input transistor.

72. A semiconductor integrated circuit having a power circuit constituted by a current mirror circuit having a plurality of field effect transistors, said current mirror circuit comprising a reference current source for supplying a reference current, an input circuit connected to said reference current source and supplied with said reference current, and at least one output circuit connected to said input circuit in a current mirror fashion, wherein:

said input circuit includes first to Xth input transistors connected in series with each other, gates of a Kth from said first to (X−2)th arbitrary input transistors are connected to a drain of (K+1)th input transistor, gates of said Xth and (X−1)th input transistors are both connected to a drain of said Xth input transistor, and the drain of said Xth input transistor is connected to said reference current source;

said output circuit includes first to Xth output transistors connected in series with each other, a source of said first output transistor is connected to a source of said first input transistor, gates of Kth to (X−2)th arbitrary output transistors are connected to the gate of said Kth input transistor, gates of said Xth and (X−1)th output transistors are connected to the gates of said Xth and (X−1)th input transistors, respectively, and an output current is produced from a drain of said Xth output transistor; and said Xth input transistor is operated with a voltage not higher than a threshold voltage of said (X−1)th input transistor.

73. A semiconductor integrated circuit having a power circuit constituted by a current mirror circuit having a plurality of field effect transistors, said current mirror circuit comprising a first reference current source for supplying a first reference current, a second reference current source for supplying a second reference current, an input circuit connected to said first and second reference current sources and supplied with said first and second reference currents, and at least one output circuit connected to said input circuit in a current mirror fashion, wherein:

said input circuit includes first and second input transistors connected in series with each other and third and fourth input transistors connected in series with each other, gates of said first and second input transistors are both connected to a drain of said second input transistor, the drain of said second input transistor is connected to said first reference current source, gates of said third and fourth input transistors are both connected to a drain of said fourth input transistor, and the drain of said fourth input transistor is connected to said second reference current source;

said output-circuit includes first and second output transistors connected in series with each other, a source of said first output transistor is connected to the sources of said first and third input transistors, a gate of said first output transistor is connected to the gates of said first and second input transistors, a gate of said second output transistor is connected to the gates of said third and fourth input transistors, and an output current is produced from a drain of said second output transistor; and said second input transistor is operated with a voltage not higher than a threshold voltage of said first input transistor, and said fourth input transistor is operated with a voltage not higher than a threshold voltage of said third input transistor.

74. A semiconductor integrated circuit having a power circuit constituted by a current mirror circuit having a plurality of field effect transistors, said current mirror circuit comprising a first reference current source for supplying a first reference current, a second reference current source for supplying a second reference current, an input circuit connected to said first and second reference current sources and supplied with said first and second reference currents, and at least one output circuit connected to said input circuit in a current mirror fashion, wherein:

said input circuit includes first and second input transistors connected in series with each other and third and fourth input transistors connected in series with each other, a gate of the first input transistor is connected to a drain of said second input transistor, the drain of said second input transistor is connected to said first reference current source, gates of said second, third and fourth input transistors are connected to a drain of said fourth input transistor, and the drain of said fourth input transistor is connected to said second reference current source;

said output circuit includes first and second output transistors connected in series with each other, a source of said first output transistor is connected to the sources of said first and third input transistors, a gate of said first output transistor is connected to the gate of said first input transistor, a gate of said second output transistor is connected to the gates of said second, third and fourth input-transistors, and an output current is produced from a drain of said second output transistor; and said fourth input transistor is operated with a voltage not higher than a threshold voltage of said third input transistor.

* * * * *